United States Patent
Kitada et al.

(10) Patent No.: US 10,468,518 B2
(45) Date of Patent: Nov. 5, 2019

(54) POWER SEMICONDUCTOR DEVICE HAVING A FIRST AND A SECOND CONDUCTIVE-TYPE COLUMNAR REGIONS FORMED ALTERNATELY WITH EACH OTHER AND METHOD OF MANUFACTURING THE POWER SEMICONDUCTOR DEVICE

(71) Applicant: SHINDENGEN ELECTRIC MANUFACTURING CO., LTD., Chiyoda-ku, Tokyo (JP)

(72) Inventors: Mizue Kitada, Saitama (JP); Takeshi Asada, Saitama (JP); Takeshi Yamaguchi, Saitama (JP); Noriaki Suzuki, Saitama (JP); Daisuke Arai, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/760,458

(22) PCT Filed: Jan. 16, 2017

(86) PCT No.: PCT/JP2017/001288
§ 371 (c)(1),
(2) Date: Mar. 15, 2018

(87) PCT Pub. No.: WO2017/130778
PCT Pub. Date: Aug. 3, 2017

(65) Prior Publication Data
US 2018/0269318 A1 Sep. 20, 2018

(30) Foreign Application Priority Data
Jan. 29, 2016 (WO) ............... PCT/JP2016/052631

(51) Int. Cl.
*H01L 29/78* (2006.01)
*H01L 29/417* (2006.01)
(Continued)

(52) U.S. Cl.
CPC ...... *H01L 29/7813* (2013.01); *H01L 29/0634* (2013.01); *H01L 29/41766* (2013.01);
(Continued)

(58) Field of Classification Search
CPC ............ H01L 29/7813; H01L 29/0634; H01L 29/41766; H01L 29/7397; H01L 29/66734;
(Continued)

(56) References Cited

U.S. PATENT DOCUMENTS

2006/0226475 A1    10/2006  Yamamoto et al.
2008/0102582 A1*   5/2008   Takei ............... H01L 29/0634
                                                            438/270
(Continued)

FOREIGN PATENT DOCUMENTS

JP    6-252090 A      9/1994
JP    2006-294853 A   10/2006
(Continued)

OTHER PUBLICATIONS

International Search Report in PCT/JP2016/052631, dated Apr. 5, 2016, 4pp.
(Continued)

Primary Examiner — Thanh T Nguyen
(74) Attorney, Agent, or Firm — Hauptman Ham, LLP

(57) ABSTRACT

A power semiconductor device of the present invention includes: a semiconductor base body which has a super junction structure formed of a plurality of first conductive-type columnar regions and a plurality of second conductive-type columnar regions; a plurality of trenches; gate insula-
(Continued)

tion films; gate electrodes; an interlayer insulation film; contact holes formed such that two or more contact holes are formed between two trenches disposed adjacently to each other; metal plugs formed by filling the inside of the contact holes with metal; and an electrode, wherein a first conductive-type high concentration diffusion region is formed only between the trench and the metal plug disposed closest to the trench between each two trenches disposed adjacently to each other. According to the power semiconductor device of the present invention, it is possible to provide a power semiconductor device which satisfies a demand for reduction in cost and downsizing of electronic equipment, and has a large breakdown strength.

8 Claims, 16 Drawing Sheets

(51) Int. Cl.
   *H01L 29/66*     (2006.01)
   *H01L 29/739*    (2006.01)
   *H01L 29/06*     (2006.01)
(52) U.S. Cl.
   CPC .... *H01L 29/6634* (2013.01); *H01L 29/66348* (2013.01); *H01L 29/66727* (2013.01); *H01L 29/66734* (2013.01); *H01L 29/7397* (2013.01)
(58) Field of Classification Search
   CPC ........... H01L 29/6634; H01L 29/66348; H01L 29/66727
   See application file for complete search history.

(56) References Cited

U.S. PATENT DOCUMENTS

| 2008/0116512 | A1  | 5/2008  | Kawaguchi et al. |
| 2014/0103426 | A1  | 4/2014  | Hsieh |
| 2014/0124855 | A1* | 5/2014  | Hebert ................ H01L 29/7813 257/334 |
| 2014/0183624 | A1  | 7/2014  | Tipirneni et al. |
| 2015/0076594 | A1* | 3/2015  | Hsieh .................. H01L 29/0619 257/334 |
| 2015/0155380 | A1* | 6/2015  | Schulze .............. H01L 29/0649 257/330 |
| 2015/0270385 | A1  | 9/2015  | Shimomura |
| 2016/0260797 | A1  | 9/2016  | Sato et al. |

FOREIGN PATENT DOCUMENTS

| JP | 2007-149867 A | 6/2007 |
| JP | 2008-153620 A | 7/2008 |
| JP | 2015-185646 A | 10/2015 |
| JP | 2016-163004 A | 9/2016 |

OTHER PUBLICATIONS

International Search Report in PCT/JP2017/001288, dated Mar. 21, 2017, 4pp.

Search Report in NL Application No. 2018242, dated Sep. 20, 2017, 12pp.

* cited by examiner

POWER SEMICONDUCTOR DEVICE HAVING A FIRST AND A SECOND CONDUCTIVE-TYPE COLUMNAR REGIONS FORMED ALTERNATELY WITH EACH OTHER AND METHOD OF MANUFACTURING THE POWER SEMICONDUCTOR DEVICE

RELATED APPLICATIONS

The present application is a National Phase of International Application Number PCT/JP2017/001288, filed Jan. 16, 2017, which claims priority to International Application Number PCT/JP2016/052631, filed Jan. 29, 2016.

TECHNICAL FIELD

The present invention relates to a power semiconductor device and a method of manufacturing a power semiconductor device.

BACKGROUND ART

Recently, along with a demand for reduction in cost and downsizing of electronic equipment, a downsized power MOSFET has been requested. As such a power MOSFET, there has been proposed a power MOSFET which electrically connects a source electrode and a source region through a metal plug to each other (a power MOSFET 900 relating to a Background Art, see FIG. 22, see patent literature 1 with respect to a semiconductor device which uses a metal plug, for example).

The power MOSFET 900 relating to Background Art includes: a semiconductor base body 910 having a low resistance semiconductor layer 912, a drift layer 914 formed on the low resistance semiconductor layer 912, p-type base regions 918 formed on a surface of the drift layer 914, and source regions 920 which are formed on a surface of the base regions 918; a plurality of trenches 922 formed such that the trenches 922 penetrate the base regions 918 and extend to a depth position where the trenches 922 reach the drift layer 914, and have respective portions of the source regions 920 exposed to inner peripheral surfaces of trenches 922; gate insulation films 924 formed on the inner peripheral surfaces of the trenches 922; gate electrodes 926 embedded in the trenches 922 by way of the gate insulation films 924; an interlayer insulation film 928 covering the base regions 918, the source regions 920, the gate insulation films 924 and the gate electrodes 926; contact holes 930 formed such that one contact hole 930 is disposed between each two trenches 922 disposed adjacently to each other, penetrates the interlayer insulation film 928 and reaches at least the base region 918; metal plugs 932 formed by filling the inside of the contact holes 930 with metal; a source electrode 936 formed on the interlayer insulation film 928 and electrically connected to the base regions 918 and the source regions 920 through the metal plugs 932; and a drain electrode 938 formed on a surface of the low resistance semiconductor layer 912.

The semiconductor base body 910 is brought into contact with bottom surfaces of the metal plugs 932, is electrically connected with the source electrode 936 through the metal plugs 932, and further has $p^+$-type high concentration diffusion regions 934 having higher dopant concentration than the base regions 918.

The power MOSFET 900 relating to Background Art includes: the contact holes 930 formed such that the contact holes 930 penetrate the interlayer insulation film 928 and reach at least the base regions 918; and the metal plugs 932 formed by filling the inside of the contact holes 930 with metal. Accordingly, unlike a power semiconductor device where a source electrode 936 and source regions 920 are directly brought into contact with each other, it is unnecessary to form contact holes having a large diameter and hence, it is possible to provide a downsized power MOSFET. As a result, the power MOSFET 900 relating to Background Art becomes a power MOSFET which satisfies a demand for reduction in cost and downsizing of electronic equipment.

CITATION LIST

Patent Literature

PTL 1: JP-A-6-252090

SUMMARY OF INVENTION

Technical Problem

However, in the power MOSFET 900 relating to Background Art, the metal plugs 932 having a relatively small diameter are formed such that one metal plug 932 is formed between each two trenches 922 disposed adjacently to each other.

Accordingly, as viewed in a plan view, a distance d2 between the trench 922 and the $p^+$-type high concentration diffusion region 934 becomes relatively long (see FIG. 23). Accordingly, the following drawbacks occur.

(1) At the time of the occurrence of an avalanche breakdown or reverse recovery of a body diode, holes which are generated at a bottom portion of the trench 922 (a place where the holes are relatively easily generated) move a relatively long distance until the holes are drawn to the source electrode 936 and hence, a high potential difference is liable to be generated between the base region 918 and the metal plug 932 whereby a parasitic npn transistor formed of the source region 920 (n type), the base region 918 (p type) and the drift layer 914 (n type) is liable to be turned on (see FIG. 23).

(2) An area of "a boundary surface between the source region 920 and the base region 918" is increased and hence, holes in the base region 918 are liable to enter the source region 920. Accordingly, the above-mentioned parasitic npn transistor is liable to be turned on also from this viewpoint (see FIG. 23).

As a result, avalanche breakdown or di/dt breakdown is liable to occur thus giving rise to a drawback that it is difficult to provide a power MOSFET having a large breakdown strength. Such a drawback is not a drawback limited to the power MOSFET and is likely to occur in all power semiconductor devices.

The present invention has been made to overcome the above-mentioned drawbacks, and it is an object of the present invention to provide a power semiconductor device which satisfies a demand for reduction in cost and downsizing of electronic equipment and having large breakdown strength. It is another object of the present invention to provide a method of manufacturing such a power semiconductor device.

Solution to Problem

[1]

A power semiconductor device according to the present invention includes: a semiconductor base body having: a low resistance semiconductor layer; a plurality of first conductive-type columnar regions and a plurality of second conductive-type columnar regions formed on the low resistance semiconductor layer such that the first conductive-type columnar region and the second conductive-type columnar region are alternately formed along a predetermined direction; second conductive-type base regions formed on surfaces of the plurality of first conductive-type columnar regions and surfaces of the plurality of second conductive-type columnar regions; and first conductive-type high concentration diffusion regions formed on surfaces of the base regions at predetermined positions, wherein a super junction structure is formed of the plurality of first conductive-type columnar regions and the plurality of second conductive-type columnar regions; a plurality of trenches formed within regions where the first conductive-type columnar regions are formed as viewed in a plan view, the trenches being formed such that the trenches penetrate the base regions and extend to a depth position where the trenches reach the first conductive-type columnar regions, the trenches allowing portions of the first conductive-type high concentration diffusion regions to be exposed on respective inner peripheral surfaces of the respective trenches; gate insulation films each of which is formed on the inner peripheral surface of each trench; gate electrodes each of which is embedded in each trench by way of the gate insulation film; an interlayer insulation film formed so as to cover the base regions, the first conductive-type high concentration diffusion regions, the gate insulation films and the gate electrodes; contact holes formed such that the contact holes penetrate the interlayer insulation film and reach at least the base regions, two or more contact holes being formed between each two trenches disposed adjacently to each other; metal plugs formed by filling the inside of the contact holes with metal; and an electrode formed on the interlayer insulation film, the electrode being electrically connected with the base regions and the first conductive-type high concentration diffusion regions through the metal plugs, wherein the semiconductor base body further comprises second conductive-type high concentration diffusion regions which are brought into contact with bottom surfaces of the metal plugs, are electrically connected with the electrode through the metal plugs, and have higher dopant concentration than the base region, and in the semiconductor base body, the first conductive-type high concentration diffusion region is formed only between the trench and the metal plug disposed closest to the trench between two trenches disposed adjacently to each other.

In this specification, "two trenches disposed adjacently to each other" is a concept which includes not only the case where two trenches are disposed adjacently to each other as viewed wholly but also the case where two trenches are disposed adjacently to each other as viewed from a predetermined cross section. For example, even in the case where the trenches are arranged in a grid array and the trenches are connected to each other, when the trenches are disposed adjacently to each other as viewed in a predetermined cross section, it is assumed that such a case is included in "two trenches disposed adjacently to each other". Further, in this specification, "between two trenches disposed adjacently to each other" includes not only the case where the trenches are disposed on a straight line as viewed in a plan view but also the case where the trenches are disposed at positions more or less displaced from the straight line.

[2]

In the power semiconductor device according to the present invention, it is preferable that, between two trenches disposed adjacently to each other, a position where the metal plug disposed closest to the trench and the first conductive-type high concentration diffusion region are brought into contact with each other be disposed outside a region where the second conductive-type columnar region is formed as viewed in a plan view.

[3]

In the power semiconductor device according to the present invention, it is preferable that, between two trenches disposed adjacently to each other, the metal plug disposed closest to the trench be formed outside a region where the second conductive-type columnar region is formed as viewed in a plan view.

[4]

In the power semiconductor device according to the present invention, it is preferable that the metal be tungsten.

[5]

In the power semiconductor device according to the present invention, it is preferable that a distance between two gate electrodes disposed adjacently to each other be 2.5 µm or more.

[6]

In the power semiconductor device according to the present invention, it is preferable that a distance between two gate electrodes disposed adjacently to each other be five or more times as large as a width of the metal plug.

[7]

In the power semiconductor device according to the present invention, it is preferable that the contact hole be formed such that the contact hole extends to a depth position deeper than a bottom surface of the first conductive-type high concentration diffusion region.

[8]

In the power semiconductor device according to the present invention, it is preferable that a depth position of a deepest portion of the base region fall within a range of from 0.5 µm to 2.0 µm.

[9]

A method of manufacturing a power semiconductor device according to present invention is a method of manufacturing a power semiconductor device for manufacturing the power semiconductor device described in any one of the above described [1] to [8], wherein the method includes in the following order: a semiconductor base body preparing step of preparing a semiconductor base body having a low resistance semiconductor layer, and a plurality of first conductive-type columnar regions and a plurality of second conductive-type columnar regions formed on the low resistance semiconductor layer such that the first conductive-type columnar region and the second conductive-type columnar region are alternately formed along a predetermined direction, wherein a super junction structure is formed of the plurality of first conductive-type columnar regions and the plurality of second conductive-type columnar regions; a trench forming step of forming a plurality of trenches within regions where the first conductive-type columnar regions are formed; a gate electrode forming step of forming a gate insulation film on an inner peripheral surface of each trench and forming a gate electrode in each trench by way of the gate insulation film; a base region forming step of forming second conductive-type base regions such that the second conductive-type base regions reach a depth position shallower than bottom portions of the trenches from surfaces of the plurality of first conductive-type columnar regions and the surfaces the plurality of second conductive-type columnar regions; a first conductive-type high concentration diffusion region forming step of forming first conductive-type high concentration diffusion regions in predetermined regions of surfaces of the base regions such that at least a portion of the first conductive-type high concentration diffusion region is exposed on an inner peripheral surface of each trench; an interlayer insulation film forming step of forming an interlayer insulation film which covers the base regions, the first conductive-type high concentration diffusion regions, the gate insulation film and the gate electrodes; a contact hole forming step of forming contact holes such that the contact holes penetrate the interlayer insulation film and reach at least the base regions, and two or more contact holes are formed between each two trenches disposed adjacently to each other; a second conductive-type high concentration diffusion region forming step of forming second conductive-type high concentration diffusion regions which are brought into contact with bottom surfaces of the contact holes and have higher dopant concentration than the base regions; a metal plug forming step of forming metal plugs by filling the inside of the contact holes with metal; and an electrode forming step of forming an electrode which is electrically connected with the base regions, the first conductive-type high concentration diffusion regions and the second conductive-type high concentration diffusion regions through the metal plugs on the interlayer insulation film, wherein in the contact hole forming step, between two trenches disposed adjacently to each other, the contact hole disposed closest to the trench is formed such that the first conductive-type high concentration diffusion region is formed only between the trench and the metal plug disposed closest to the trench.

[10]

In the method of manufacturing a power semiconductor device according to the present invention, the semiconductor base body preparing step includes in the following order: a first step of preparing a semiconductor base body where a low resistance semiconductor layer and a first conductive-type semiconductor layer formed on the low resistance semiconductor layer and having lower dopant concentration than the low resistance semiconductor layer are stacked to each other; a second step of forming a plurality of second conductive-type column trenches having a predetermined depth by etching which uses an insulation film as a mask such that the plurality of the second conductive-type column trenches are arranged along a predetermined direction on a surface of the first conductive-type semiconductor layer; a third step of forming a second conductive-type embedded layer in the second conductive-type column trench by an epitaxial growth of a second conductive-type semiconductor material to a height position exceeding a surface height of the insulation film; a fourth step of removing a portion of the second conductive-type embedded layer exceeding the surface height of the insulation film; and a fifth step of forming a second conductive-type columnar region by etching such that a surface of the second conductive-type embedded layer is disposed deeper than a depth position of a bottom surface of the insulation film.

According to the power semiconductor device and the method of manufacturing a power semiconductor device of the present invention, the power semiconductor device includes: the contact holes formed such that the contact holes penetrate the interlayer insulation film and reach at least the base regions; and the metal plugs formed by filling the inside of the contact holes with metal. Accordingly, in the same manner as the power MOSFET 900 described in Background Art, it is unnecessary to form contact holes having a large diameter as in the case of a power semiconductor device where a source electrode is directly brought into contact with source regions and hence, it is possible to provide a downsized power semiconductor device. As a result, the power semiconductor device according to the present invention becomes a power semiconductor device which satisfies a demand for reduction in cost and downsizing of electronic equipment.

In the power semiconductor device and the method of manufacturing a power semiconductor device of the present invention, the power semiconductor device includes the contact holes formed such that the contact holes penetrate the interlayer insulation film and reach at least the base regions, and two or more contact holes are formed between two trenches disposed adjacently to each other, and the metal plugs which are formed by filling the inside of the contact holes with metal.

With such a configuration, as viewed in a plan view, a distance d1 between the trench and the second conductive-type high concentration diffusion region becomes shorter than the distance d2 in the power MOSFET 900 according to the Background Art (see FIG. 8). Accordingly, the following effects are obtained. (1) At the time of the occurrence of an avalanche breakdown or reverse recovery of a body diode, carriers generated in a bottom portion of a trench (a place where carriers (for example, holes) are relatively easily generated) move a relatively small distance until the carriers are drawn to the electrode and hence, a high potential difference is minimally generated between a base region and a metal plug. Accordingly, a parasitic transistor (parasitic npn transistor) formed of a first conductive-type high concentration diffusion region (for example, n type), a base region (for example, p type) and a first conductive-type columnar region (for example, n type) is minimally turned on (see FIG. 8). (2) An area of "the boundary surface between the first conductive-type high concentration diffusion region and the base region" becomes narrow and hence, carriers in the base region minimally enter the first conductive-type high concentration diffusion region whereby, also from this point of view, the above-mentioned parasitic transistor (parasitic npn transistor) is minimally turned on (see FIG. 8).

As a result, avalanche breakdown or di/dt breakdown minimally occurs and hence, it is possible to provide a power semiconductor device having large breakdown strength.

Accordingly, the power semiconductor device and the method of manufacturing a power semiconductor device provide a power semiconductor device which satisfies a demand for reduction in cost and downsizing of electronic equipment, and has a large breakdown strength.

In the power semiconductor device and the method of manufacturing a power semiconductor device of the present invention, the power semiconductor device includes: the contact holes which are formed such that two or more contact holes are formed between two trenches disposed adjacently to each other; and the metal plugs which are formed by filling the inside of the contact holes with metal. Accordingly, the power semiconductor device can reduce contact resistance compared to the case where the contact holes are formed such that one contact hole is formed between two trenches disposed adjacently to each other, and the metal plug is formed by filling the inside of the contact hole with metal.

In the power semiconductor device and the method of manufacturing a power semiconductor device of the present invention, the first conductive-type high concentration diffusion region is formed only between the trench and the metal plug disposed closest to the trench between two trenches disposed adjacently to each other. With such a configuration, an area of "the boundary surface between the first conductive-type high concentration diffusion region and the base region" becomes narrow and hence, carriers (holes) generated in the vicinity of the bottom portion of the trench in the first conductive-type columnar region further minimally enter the first conductive-type high concentration diffusion region whereby the above-mentioned parasitic npn transistor is minimally turned on with more certainty.

In the power semiconductor device and the method of manufacturing a power semiconductor device of the present invention, the power semiconductor device includes the semiconductor base body which has a super junction structure formed of n-type columnar regions and p-type columnar regions and hence, it is possible to provide a switching element having a low ON resistance and a high breakdown strength.

In the power semiconductor device and the method of manufacturing a power semiconductor device of the present invention, the power semiconductor device includes the semiconductor base body which has a super junction structure formed of the n-type columnar regions and the p-type columnar regions and hence, even when the power semiconductor device is a power semiconductor device having such a high breakdown strength, it is possible to provide a power semiconductor device which satisfies a demand for reduction in cost and downsizing of electronic equipment, and has a large breakdown strength.

In the power semiconductor device which includes the semiconductor base body having a super junction structure formed of the first conductive-type columnar regions and the second conductive-type columnar regions, at the time of the occurrence of an avalanche breakdown or reverse recovery of a body diode, a large amount of carriers (holes) are generated in the second conductive-type columnar region. The carriers (holes) generated in the second conductive-type columnar region move toward the electrode (for example, the source electrode) side, and are drawn to the electrode (for example, source electrode) through the second conductive-type high concentration diffusion region and the metal plugs.

However, when the first conductive-type high concentration diffusion region is formed also between two metal plugs disposed adjacently to each other between two trenches disposed adjacently to each other, carriers (holes) generated in the second conductive-type columnar region move to an area near the first conductive-type high concentration diffusion region formed between two metal plugs disposed adjacently to each other and hence, carriers (holes) generated in the second conductive-type columnar region are liable to enter the first conductive-type high concentration diffusion region. Accordingly, the parasitic transistor (parasitic npn transistor) which is formed of the first conductive-type high concentration diffusion region (for example, n-type), the base region (for example, p-type) and the first conductive-type columnar region (for example, n-type) disposed between two metal plugs disposed adjacently to each other is liable to be turned on.

To the contrary, according to the power semiconductor device and the method of manufacturing a power semiconductor device of the present invention, the power semiconductor device includes the semiconductor base body having a super junction structure formed of the first conductive-type columnar regions and the second conductive-type columnar regions, and the first conductive-type high concentration diffusion region is formed only between the trench and the metal plug disposed closest to the trench between two trenches disposed adjacently to each other. Accordingly, carriers (holes) generated in the second conductive-type columnar region do not move an area near the first conductive-type high concentration diffusion region and hence, there is no possibility that carriers (holes) enter the first conductive-type high concentration diffusion region. Accordingly, there is no possibility that the parasitic transistor (parasitic npn transistor) which is formed of the first conductive-type high concentration diffusion region (for example, n-type), the base region (for example, p-type) and the first conductive-type columnar region (for example, n-type) disposed between two metal plugs disposed adjacently to each other is turned on. Accordingly, even when the power semiconductor device includes the semiconductor base body having the super junction structure formed of the first conductive-type columnar regions and the second conductive-type columnar regions, avalanche breakdown or di/dt breakdown minimally occurs thus providing a power semiconductor device having high breakdown strength.

BRIEF DESCRIPTION OF DRAWINGS

FIG. 2A to FIG. 2D are cross-sectional views for explaining the method of manufacturing a power semiconductor device according to the embodiment 1, wherein FIG. 2A to FIG. 2D are views showing respective steps.

FIG. 3A to FIG. 3D are cross-sectional views for explaining the method of manufacturing a power semiconductor device according to the embodiment 1, wherein FIG. 3A to FIG. 3D are views showing respective steps.

FIG. 4A to FIG. 4C are cross-sectional views for explaining a method of manufacturing a power semiconductor device according to the embodiment 1, wherein FIG. 4A to FIG. 4C are views showing respective steps.

FIG. 5A to FIG. 5C are cross-sectional views for explaining the method of manufacturing a power semiconductor device according to the embodiment 1, wherein FIG. 5A to FIG. 5C are views showing respective steps.

FIG. 6A to FIG. 6C are cross-sectional views for explaining a method of manufacturing a power semiconductor device according to the embodiment 1, wherein FIG. 6A to FIG. 6C are views showing respective steps.

FIG. 7A to FIG. 7C are cross-sectional views for explaining a method of manufacturing a power semiconductor device according to the embodiment 1, wherein FIG. 7A to FIG. 7C are views showing respective steps.

FIG. 8 corresponds to a region surrounded by a broken line A in FIG. 1 (the same goes for FIG. 10). In FIG. 8, open circles indicate holes respectively.

FIG. 11A is a view showing a state of a surface of a semiconductor base body immediately before a source region forming step is performed in a case where a source region is formed also in a region where a p-type columnar region is formed as viewed in a plan view, FIG. 11B is a view showing a state of the surface of the semiconductor base body after the source region forming step is performed in a case where a metal plug disposed closest to a trench between two trenches disposed adjacently to each other as viewed in a plan view is formed in a region where the p-type columnar region is formed, and FIG. 11C is a view showing a state of the surface of the semiconductor base body after a metal plug forming step is performed in the embodiment 1. FIG. 11A to FIG. 11C are views corresponding to a region surrounded by a broken line B in FIG. 5B. For simplifying the explanation, in FIG. 11A to FIG. 11C, a thermal oxide film 124' is omitted, and with respect to the source region 120, the metal plug 132 and the p$^+$-type diffusion region 134, only the configuration on a right end side of the P-type columnar region 116 as viewed in a plan view is shown. In FIG. 11B, a metal plug 132 formed in the metal plug forming step is also shown. Further, in FIG. 11A to FIG. 11C, symbol G indicates particles.

In FIG. 14, a source electrode and an interlayer insulation film are omitted (the same goes for FIG. 15 to FIG. 19).

In FIG. 21, symbol 210 indicates a semiconductor base body, symbol 212 indicates a low resistance semiconductor layer, symbol 213 indicates a buffer layer, symbol 214 indicates an n-type columnar region, symbol 215 indicates an n-type semiconductor layer, symbol 216 indicates a p-type columnar region, symbol 218 indicates a base region, symbol 220 indicates a source region, symbol 224 indicates a gate insulation film, symbol 226 indicates a gate electrode, symbol 228 indicates an interlayer insulation film, symbol 230 indicates a contact hole, symbol 232 indicates a metal plug, symbol 234 indicates a p$^+$-type diffusion region, symbol 236 indicates a source electrode, symbol 238 indicates a drain electrode, and symbol 240 indicates a surface high concentration diffusion region.

FIG. 23 corresponds to a region surrounded by a broken line C in FIG. 22. Further, in FIG. 23, open circles indicate holes, and black circles indicate electrons.

DESCRIPTION OF EMBODIMENTS

Figure 1:
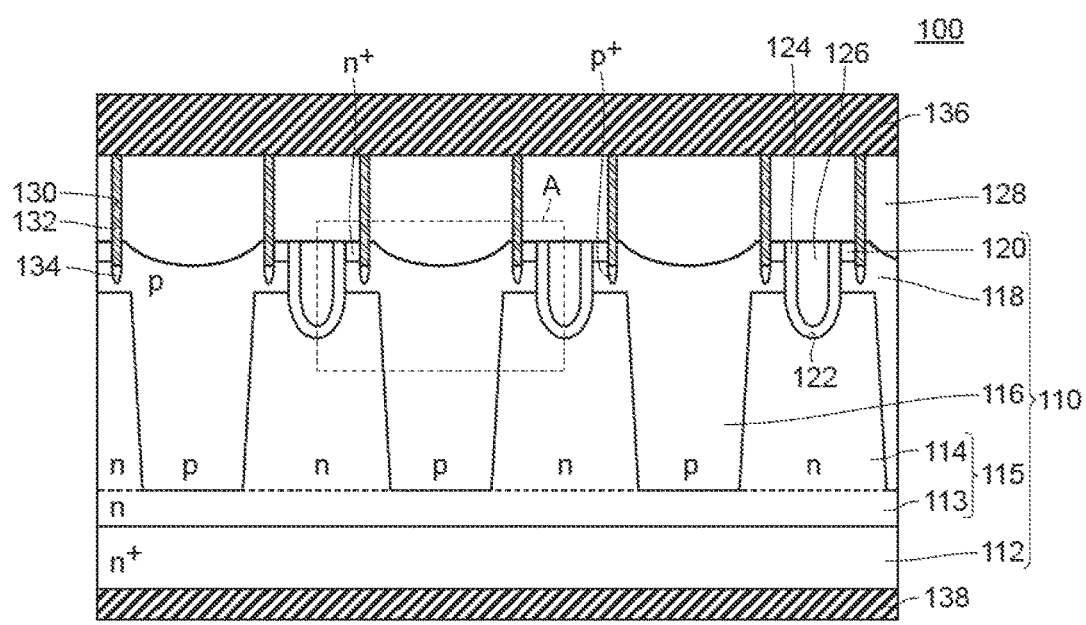
FIG. 1 is a cross-sectional view of a power semiconductor device 100 according to an embodiment 1.

Hereinafter, a power semiconductor device and a method of manufacturing a power semiconductor device of the present invention are explained based on embodiments shown in the drawings. The respective drawings are schematic views, and are not always strictly reflected by actual sizes.

[Embodiment 1]

1. Configuration of Power Semiconductor Device 100 According to Embodiment 1

The power semiconductor device 100 according to the embodiment 1 is a trench gate power MOSFET used for various kinds of power source devices such as a DC-DC converter. A breakdown voltage of the power semiconductor device 100 according to the embodiment 1 is 300V or more. For example, the breakdown voltage is 600V.

As shown in FIG. 1, the power semiconductor device 100 according to the embodiment 1 includes: a semiconductor base body 110; a plurality of trenches 122; gate insulation films 124; gate electrodes 126; an interlayer insulation film 128; contact holes 130; metal plugs 132; a source electrode 136; and a drain electrode 138.

The semiconductor base body 110 includes: a low resistance semiconductor layer 112; a buffer layer 113 which is formed on the low resistance semiconductor layer 112; a plurality of n-type columnar regions 114 (first conductive-type columnar regions) and a plurality of p-type columnar regions 116 (second conductive-type columnar regions) which are formed on the buffer layer 113 such that the n-type columnar region 114 and the p-type columnar region 116 are alternately formed along a predetermined direction; p-type base regions 118 which are formed on surfaces of the plurality of n-type columnar regions 114 and surfaces of the plurality of p-type columnar regions 116; source regions 120 (first conductive-type high concentration diffusion regions) which are arranged on surfaces of the base regions 118; and p$^+$-type diffusion regions 134 (second conducive high concentration diffusion regions) which are brought into contact with bottom surfaces of the metal plugs 132, are electrically connected to the base regions 118 and the source regions 120 via the metal plugs 132, and have higher dopant concentration than the base regions 118, wherein the super junction structure is formed of the plurality of n-type columnar regions 114 and the plurality of p-type columnar regions 116. The buffer layer 113 and the n-type columnar regions 114 are integrally formed with each other, and an n-type semiconductor layer 115 is formed of the buffer layer 113 and the n-type columnar regions 114.

The n-type columnar regions 114 and the p-type columnar regions 116 are formed such that a total dopant amount in the n-type columnar regions 114 (a total amount of dopant in the n-type columnar regions) and a total dopant amount in the p-type columnar regions 116 (a total amount of dopant in the p-type columnar regions) become equal to each other. That is, a charge in the n-type columnar regions 114 and a charge in the p-type columnar regions 116 are balanced. Further, recessed portions are formed on a surface of the semiconductor base body 110 such that the recessed portion is formed over the whole region where the p-type columnar region 116 is formed and the recessed portion is formed on a portion of the region where n-type columnar region 114 is formed.

In the semiconductor base body 110, the source region 120 is formed only between the trench 122 and the metal plug 132 disposed closest to the trench 122 between two trenches 122 which are disposed adjacently to each other. In other words, the source region 120 is formed only in the n-type columnar region, one end portion of the source region 120 is brought into contact with the trench 122, and the other end portion of the source region 120 is brought into contact with the metal plug 132.

In the power semiconductor device 100 according to the embodiment 1, both the p-type columnar region 116 and the source region 120 have a stripe shape as viewed in a plan view. However, the p-type columnar region 116 and the source region 120 may have a circular shape (a columnar shape as viewed in a stereoscopic view), a quadrangular frame shape, a circular frame shape, a grid shape or the like as viewed in a plan view.

A thickness of the low resistance semiconductor layer 112 is set to a value which falls within a range of from 100 μm to 400 μm, for example, and a dopant concentration in the low resistance semiconductor layer 112 is set to a value which falls within a range of from $1\times10^{-19}$ cm$^{-3}$ to $1\times10^{20}$ cm$^{-3}$, for example. A thickness of the n-type semiconductor layer 115 is set to a value which falls within a range of from 5 μm to 120 μm, for example, and a dopant concentration in the n-type semiconductor layer 115 is set to a value which falls within a range of from $5\times10^{13}$ cm$^{-3}$ to $1\times10^{16=3}$, for example. A depth position of a deepest portion of the base region 118 is set to a value which falls within a range of from 0.5 μm to 2.0 μm, for example, and a dopant concentration in the base region 118 is set to a value which falls within a range of from $5\times10^{16}$ cm$^{-3}$ to $1\times10^{18}$ cm$^{-3}$, for example. A depth position of a deepest portion of the source region 120 is set to a value which falls within a range of from 0.1 μm to 0.4 μm, for example, and a dopant concentration in the source region 120 is set to a value which falls within a range of from $5\times10^{19}$ cm$^{-3}$ to $2\times10^{20}$ cm$^{-3}$, for example.

The p$^+$-type diffusion regions 134 are formed such that a depth position of a deepest portion of the p$^+$-type diffusion region 134 is set deeper than that of the source region 120. A dopant concentration in the p$^+$-type diffusion region 134 is set higher than the dopant concentration in the base region 118, and is set to a value which falls within a range of from $5\times10^{18}$ cm$^{-3}$ to $1\times10^{20}$ cm$^{-3}$, for example.

Each of the plurality of trenches 122 is formed such that the trench extends to a depth position reaching the n-type columnar region 114 after penetrating the base region 118 within a region where the n-type columnar region 114 is formed as viewed in a plan view, and is formed such that a portion of the source region 120 is exposed to an inner peripheral surface of the trench 122. A depth of the trench 122 is set to 3 μm, for example.

The gate insulation film 124 is formed on the inner peripheral surface of the trench 122. The gate electrode 126 is embedded in the trench 122 by way of the gate insulation film 124. The interlayer insulation film 128 covers the base region 118, the source regions 120, the gate insulation films 124, and the gate electrodes 126.

The gate insulation film 124 is formed of a silicon dioxide film which is formed by a thermal oxidation method, and a thickness of the gate insulation film 124 is set to 100 nm, for example. The gate electrode 126 is made of low-resistance polysilicon formed by a CVD method or anion injection method. The interlayer insulation film 128 is formed of a thermal oxidation film and a PSG film formed by a CVD method, and a thickness of the interlayer insulation film 128 is set to 1000 nm, for example.

The contact holes 130 are formed such that two or more contact holes 130 are formed between each two trenches 122 which are disposed adjacently to each other (two contact holes in the embodiment 1), and the contact holes 130 penetrate the interlayer insulation film 128 and reach at least the base regions 118. The metal plug 132 is formed by filling the inside of the contact hole 130 with metal.

The contact holes 130 and the metal plugs 132 are formed such that they reach a depth position deeper than a depth position of the bottom portions of the source regions 120 as measured from a depth position of the surface of the base region 118. A stripe width of the contact hole 130 and a stripe width of the metal plug 132 are respectively set to 0.5 μm, for example.

A barrier metal (not shown in the drawing) is formed on an inner surface of the contact hole 130, and the metal plug 132 is formed such that metal is filled in the contact hole 130 by way of the barrier metal. Metal filled in the contact hole 130 is tungsten, for example.

In the power semiconductor device 100 according to the embodiment 1, the trenches 122, the gate electrodes 126, the contact holes 130, and the metal plugs 132 are respectively formed into a stripe shape as viewed in a plan view. A distance between two gate electrodes 126 disposed adjacently to each other is five or more times as large as a width (a stripe width) of the metal plug 132. To be more specific, a distance (a pitch width) between two gate electrodes 126 disposed adjacently to each other is set to 2.5 μm or more. For example, the distance between two gate electrodes 126 is set to 10 μm, for example.

Between two trenches 122 disposed adjacently to each other, the metal plugs 132 are disposed at equal pitches, and a distance between either one of two trenches 122 and the metal plug 132 disposed closest to such one of two trenches 122 is set equal to a distance between two metal plugs 132 disposed adjacently to each other. With such a configuration, it is possible to obtain an advantageous effect that the concentration of an electric field on the bottom portions of the trenches 122 can be easily alleviated when a reverse bias is applied.

A distance between the metal plugs 132 is set equal to or more than a stripe width of the metal plug 132. The distance between the metal plugs 132 is 0.5 μm or more, for example.

Between two trenches 122 disposed adjacently to each other, the metal plug 132 disposed closest to the trench 122 (the gate electrode 126) is formed outside the region where the p-type columnar region 116 is formed as viewed in a plan view. Accordingly, between two trenches 122 disposed adjacently to each other, a position where the metal plug 132 disposed closest to the trench 122 and the source region 120 are brought into contact with each other is disposed outside the region where the p-type columnar region 116 is formed as viewed in a plan view.

The source electrode 136 is formed on the interlayer insulation film 128, and the source electrode 136 is electrically connected to the base region 118 and the source regions 120 through the metal plugs 132. The drain electrode 138 is formed on a surface of the low resistance semiconductor layer 112.

The source electrode 136 is made of aluminum-base metal (for example, Al—Cu-based alloy) formed by a sputtering method and having a thickness of 4 μm, for example. The drain electrode 138 is formed of a multilayer metal film made of Ti—Ni—Au or the like, and a whole thickness of the drain electrode 138 in the form of the multilayer metal film is set to 0.5 μm, for example.

2. Method of Manufacturing Power Semiconductor Device According to Embodiment 1

Next, the power semiconductor device 100 according to the embodiment 1 can be manufactured by a manufacturing method (method of manufacturing a power semiconductor device according to the embodiment 1) which includes the following manufacturing steps. The method of manufacturing a power semiconductor device according to the embodiment 1 includes: a semiconductor base body preparing step; a trench forming step; a gate electrode forming step; a base region forming step; a source region forming step (first conductive-type high-concentration diffusion region forming step); an interlayer insulation film forming step; a contact hole forming step; a p$^+$-type diffusion region forming step (second conductive-type high-concentration diffusion region forming step); a metal plug filling step; and an electrode forming step in this order.

(1) Semiconductor Base Body Preparing Step

Firstly, the semiconductor base body 110 which includes: the low resistance semiconductor layer 112; and the plurality of n-type columnar regions 114 and the plurality of p-type columnar regions 116 which are formed on the low resistance semiconductor layer 112 such that the n-type columnar region 114 and the p-type columnar region 116 are alternately formed along a predetermined direction and where the super junction structure is formed of the plurality of n-type columnar regions 114 and the plurality of p-type columnar regions 116 is prepared. To be more specific, the semiconductor base body 110 is prepared by performing the following steps.

(1-1) First Step

Figure 2A:
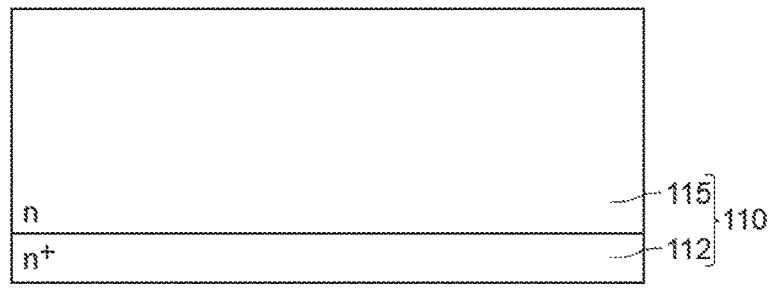

First, the semiconductor base body 110 where the low resistance semiconductor layer 112 and the n-type semiconductor layer 115 (first conductive-type semiconductor layer) which is formed on the low resistance semiconductor layer 112 and has the lower dopant concentration than the low resistance semiconductor layer 112 are stacked to each other is prepared (see FIG. 2A). As the semiconductor base body 110, a suitable semiconductor base body can be used. For example, a semiconductor base body formed by forming the n$^-$-type n-type semiconductor layer 115 on the n$^+$-type low resistance semiconductor layer 112 by an epitaxial growth method can be used.

(1-2) Second Step

Figure 2B:
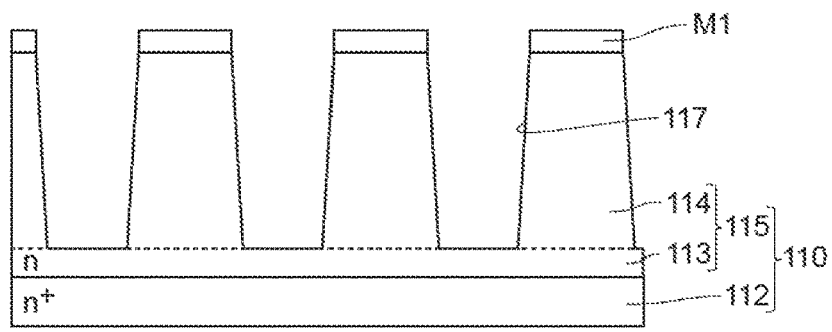

Next, a plurality of p-type column-use trenches 117 (second conductive-type column-use trenches) having a predetermined depth are formed by etching which uses an insulation film M1 as a mask such that the plurality of p-type column-use trenches 117 are arranged on the surface of the n-type semiconductor layer 115 along a predetermined direction (see FIG. 2B). A thickness of the insulation film M1 is set to a suitable thickness. In the n-type semiconductor layer 115, a layer ranging from a depth position of the p-type column-use trenches 117 to a depth position of a boundary surface between the low resistance semiconductor layer 112 and the n-type semiconductor layer 115 forms the buffer layer 113.

(1-3) Third Step

Figure 2C:
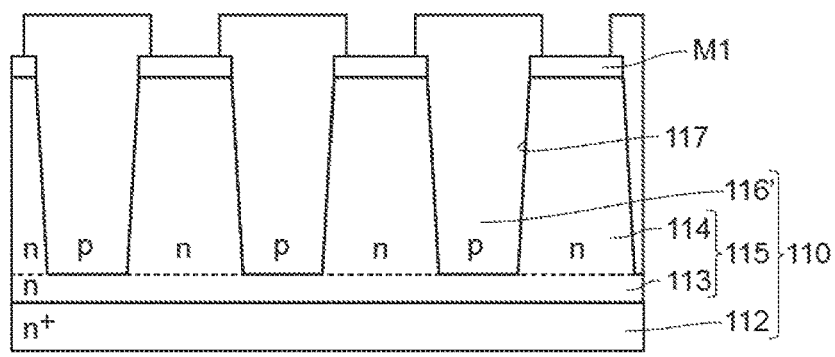

Next, a p-type embedded layer 116' (a second conductive-type embedded layer) is formed in each p-type column-use trench 117 by epitaxially growing a p-type semiconductor material (second conductive-type semiconductor material) to a height position exceeding a surface height of the insulation film M1 (see FIG. 2C).

(1-4) Fourth Step

Figure 2D:
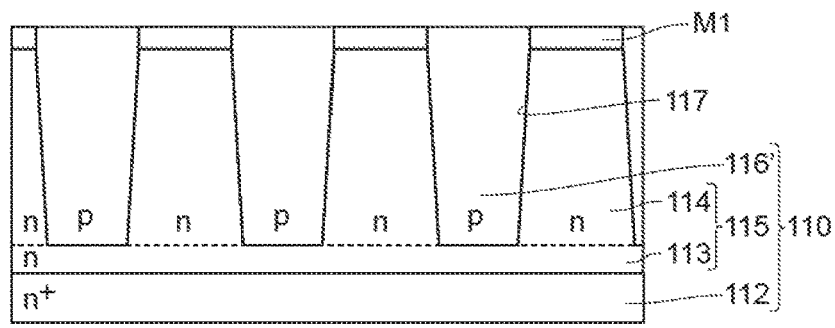

Next, a portion of each p-type embedded layer 116' which exceeds the surface height of the insulation film M1 is removed by a CMP method (see FIG. 2D).

(1-5) Fifth Step

Figure 3A:
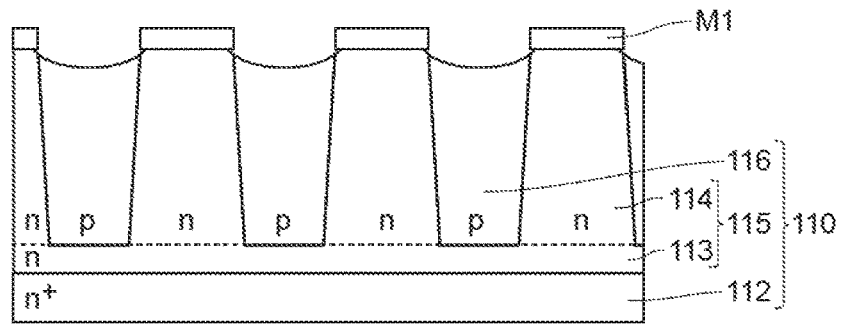

Next, a surface of each p-type embedded layer 116' is etched such that the surface of the p-type embedded layer 116' is positioned deeper than a depth position of a bottom surface of the insulation film M1 (see FIG. 3A). A method of etching may be isotropic etching or may be anisotropic etching (in the embodiment 1, isotropic etching). In this manner, the p-type embedded layer 116' filled in each p-type column-use trench 117 forms the p-type columnar region 116.

Figure 3B:
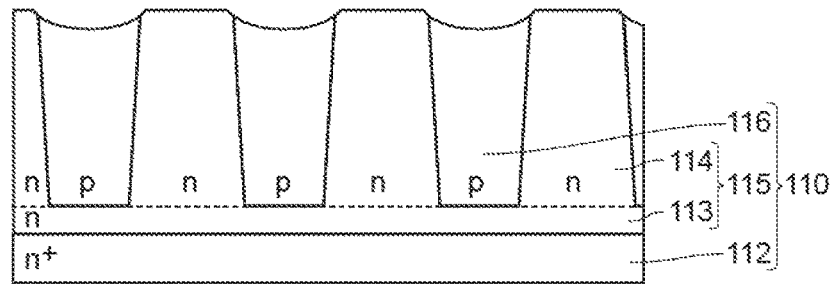

Next, the insulation film M1 is removed (see FIG. 3B) so that the semiconductor base body 110 is prepared.

(2) Trench Forming Step

Figure 3C:
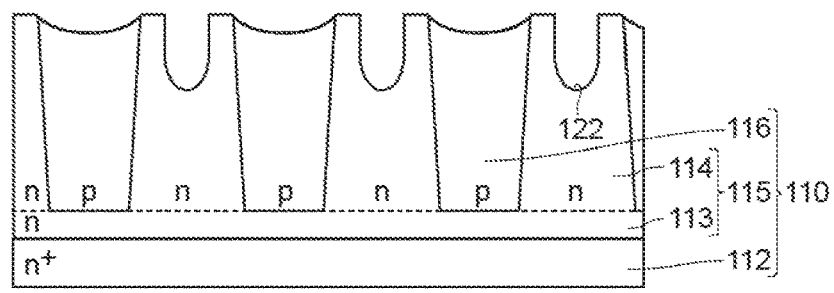

Next, the plurality of trenches 122 are formed in regions where the n-type columnar regions 114 are formed respectively. To be more specific, a mask (not shown in the drawing) having openings corresponding to the trenches 122 is formed on portions of the n-type columnar regions 114 as well as on the whole surfaces of the p-type columnar regions 116, and etching is performed using the mask thus forming the plurality of trenches 122 (see FIG. 3C). Next, the mask is removed after etching, and the surfaces of the trenches 122 are made smooth by sacrificial oxidation.

(3) Gate Electrode Forming Step

Figure 3D:
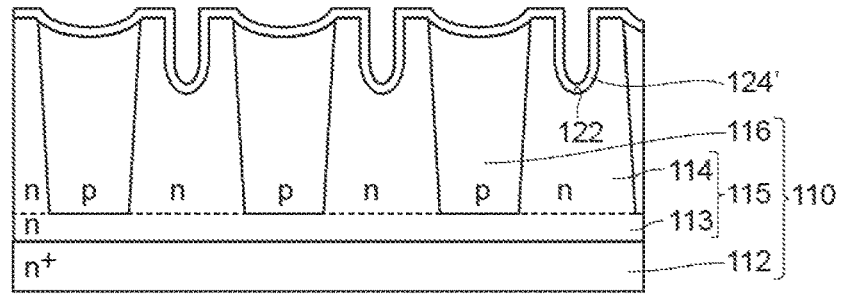
Figure 4A:
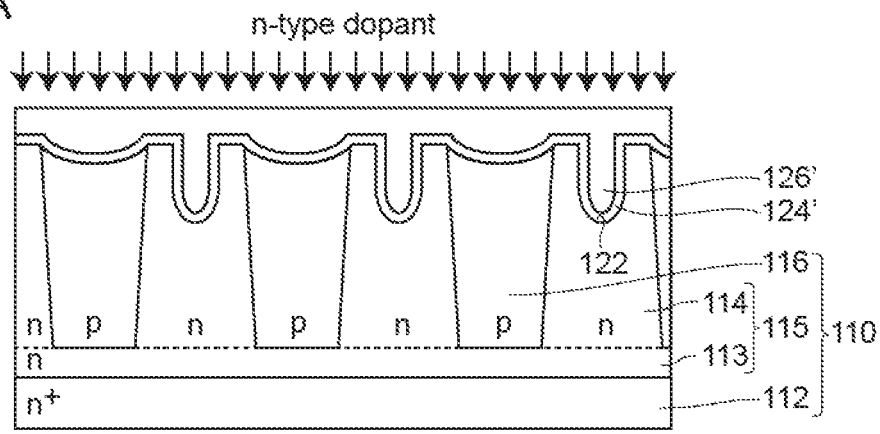
Figure 4B:
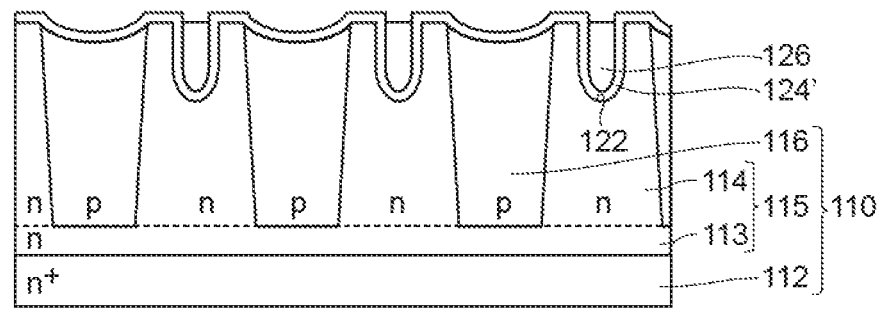

Next, a thermal oxidation film 124' is formed on the surface of the semiconductor base body 110 including the inner peripheral surfaces of the trenches 122 by thermal oxidation (see FIG. 3D). Then, the thermal oxidation film on each inner peripheral surface of the trench 122 forms the gate insulation film 124. Thereafter, polysilicon 126' is deposited on the thermal oxidation film 124'. Subsequently, an n-type dopant (for example, phosphorus) are injected into the whole surface of polysilicon 126' by ion-implantation (see FIG. 4A) such that the n-type dopant is thermally diffused. Next, polysilicon is removed except for polysilicon in the trenches 122. With such a treatment, the gate electrode 126 is formed in each trench 122 with the gate insulation film 124 interposed between the trench 122 and the gate electrode 126 (see FIG. 4B).

(4) Base Region Forming Step

Figure 4C:
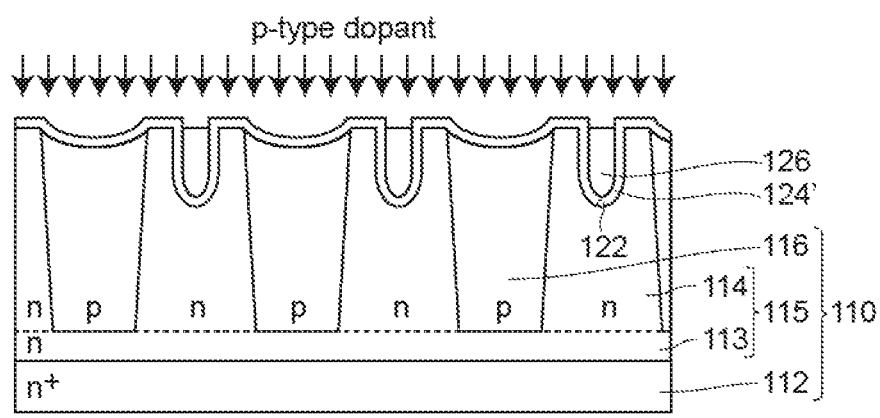
Figure 5A:
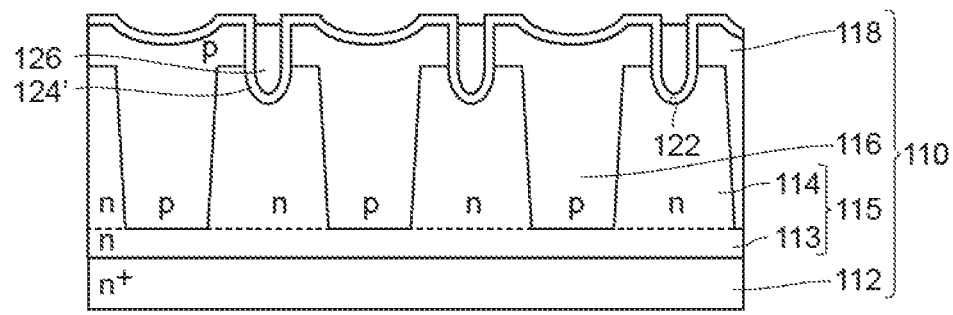

Next, a p-type dopant (for example, boron) is injected by ion implantation into a surface of the semiconductor base body 110 through the thermal oxidation film 124' (see FIG. 4C). Subsequently, by thermally diffusing the p-type dopant, the base region 118 is formed ranging from the surface of the semiconductor base body 110 to a depth position shallower than a lowermost bottom portion of the trench 122 (see FIG. 5A).

(5) Source Region Forming Step (First Conductive-Type High Concentration Diffusion Region Forming Step)

Figure 5B:
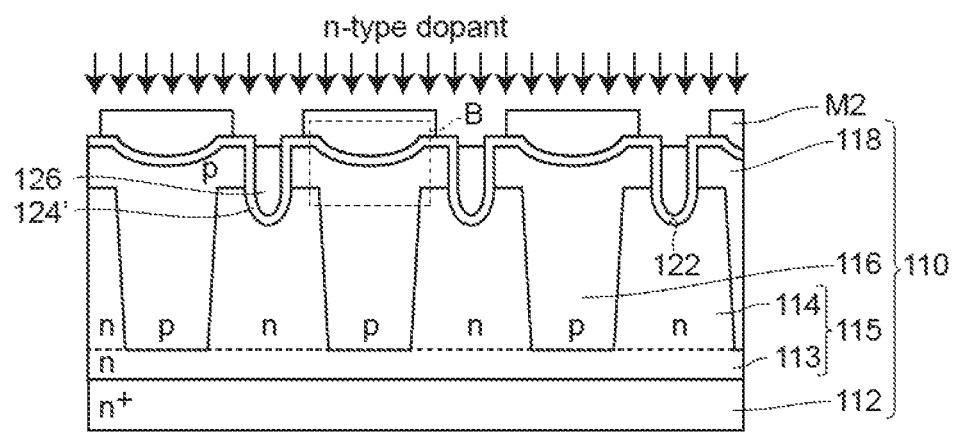
Figure 5C:
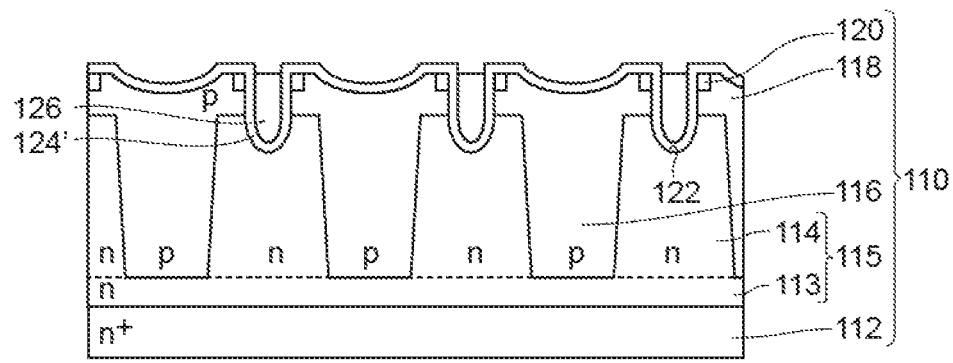

Next, a mask M2 having openings corresponding to the source regions 120, the gate insulation films 124 and the gate electrodes 126 is formed on the thermal oxidation film 124', and an n-type dopant (for example, arsenic) is injected by ion-implantation through the mask M2 (see FIG. 5B). Subsequently, the mask M2 is removed. Thereafter, by thermally diffusing the n-type dopant, the source regions 120 each of which has a portion thereof exposed to the inner peripheral surface of the trench 122 are formed in predetermined regions of a surface of the base region 118 (see FIG. 5C).

(6) Interlayer Insulation Film Forming Step

Figure 6A:
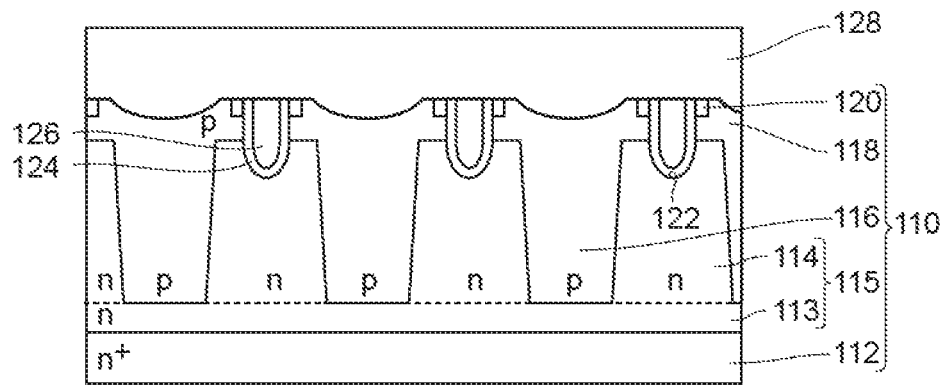

Next, the interlayer insulation film 128 which covers the base region 118, the source regions 120, the gate insulation films 124, and the gate electrodes 126 is formed (see FIG. 6A). To be more specific, a PSG film is formed on the thermal oxidation film 124' and the gate electrodes 126 by a CVD method. With such a treatment, the interlayer insulation film 128 formed of the thermal oxidation film 124' and the PSG film is formed.

(7) Contact Hole Forming Step

Figure 6B:
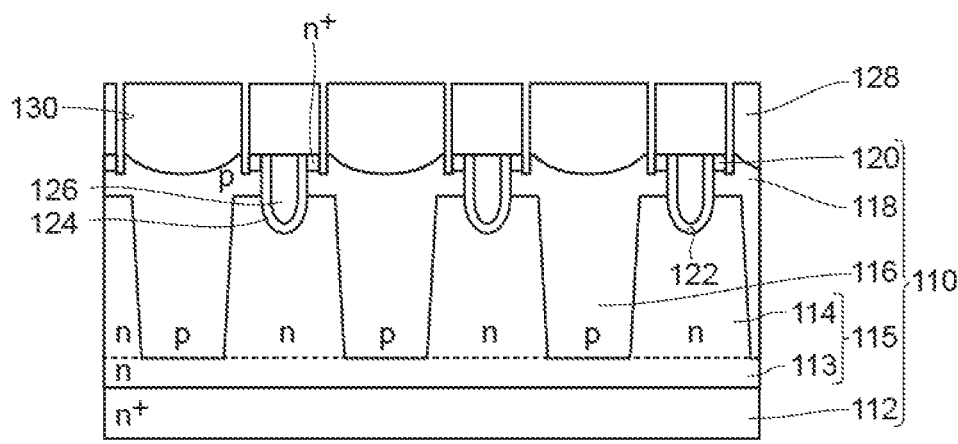

Next, a mask (not shown in the drawing) having two openings corresponding to contact holes 130 between each two trenches 122 disposed adjacently to each other is formed on a surface of the interlayer insulation film 128. In the contact hole forming step, the contact hole 130 disposed closest to the trench 122 is formed such that the source region 120 is formed only between the trench 122 and the metal plug 132 disposed closest to the trench 122 between two trenches 122 disposed adjacently to each other. In other words, the contact hole 130 disposed closest to the trench 122 is formed at a position where a side wall of the contact hole 130 on a trench 122 side is brought into contact with the source region 120, and a side wall of the contact hole 130 on a side opposite to the trench 122 side is brought into contact with the base region 118. Next, the contact holes 130 are formed by performing etching using the mask such that the contact holes 130 penetrate the interlayer insulation film 128 and reach the base regions 118. After etching, the mask is removed (see FIG. 6B).

(8) $p^+$-Type Diffusion Region Forming Step (Second Conductive-Type High Concentration Diffusion Region Forming Step)

Figure 6C:
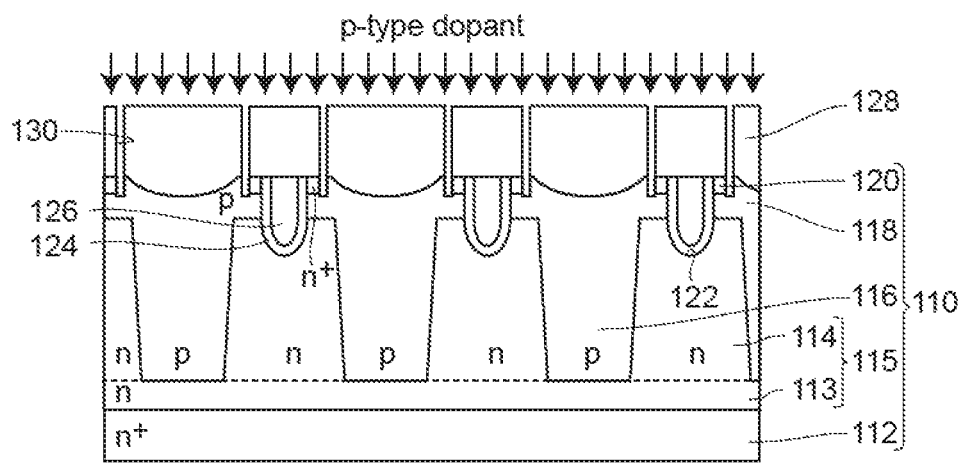
Figure 7A:
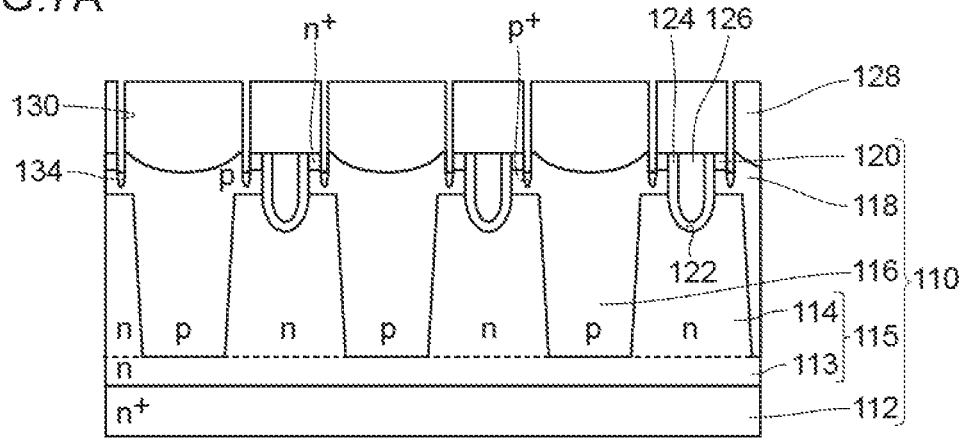

Next, a p-type dopant (for example, boron) are injected into bottom surfaces of the contact holes 130 by ion implantation with a higher dopant concentration than the base regions 118 (see FIG. 6C). Subsequently, by thermally diffusing the p-type dopant, the $p^+$-type diffusion regions 134 which are brought into contact with the bottom surfaces of the contact holes 130 are formed (see FIG. 7A).

(9) Metal Plug Filling Step

Figure 7B:
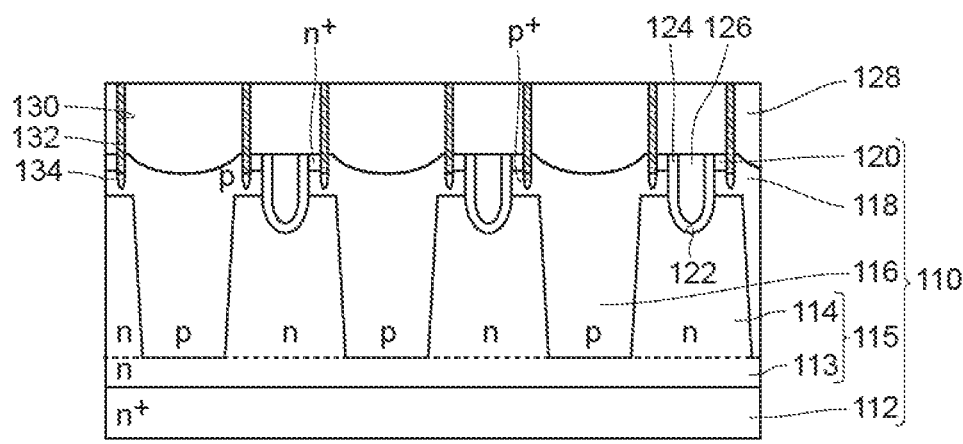

Next, a barrier metal (not shown in the drawing) is formed as a film on an inner side surface of each contact hole 130 by a sputtering method, and the barrier metal is annealed. Subsequently, by forming a film made of tungsten on the barrier metal by a CVD method, tungsten is filled in the contact hole 130 through the barrier metal. Next, by removing tungsten on the interlayer insulation film 128 by a CMP method, tungsten remains only in the contact hole 130 thus forming the metal plug 132 (see FIG. 7B). As a composition of the barrier metal, titanium nitride (TiN), titanium tungsten (TiW), molybdenum silicon (MoSi) or the like can be used.

(10) Electrode Forming Step

Figure 7C:
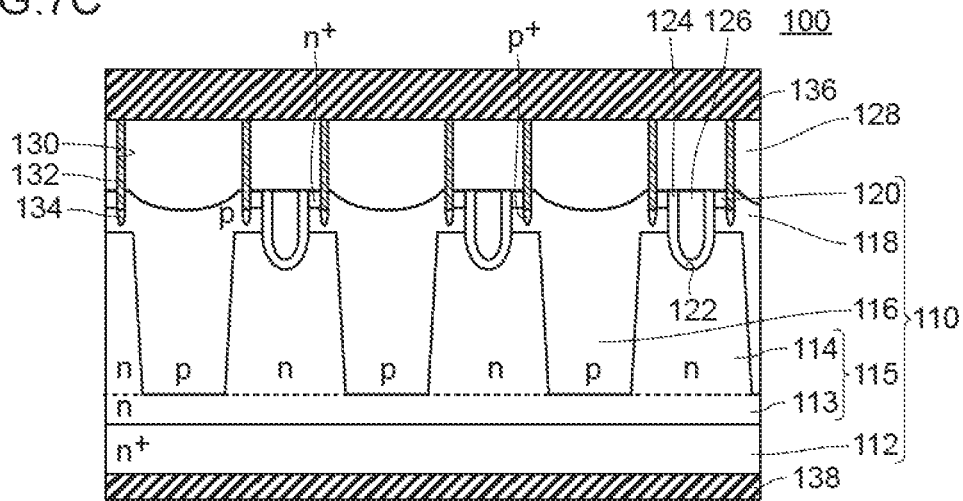

Next, a film made of Al—Cu-based metal is formed on the interlayer insulation film 128 and the metal plugs 132 by a sputtering method thus forming the source electrode 136 which is electrically connected with the base regions 118, the source regions 120 and the $p^+$-type diffusion regions 134 through the metal plugs 132. A multi-layer metal film such as a Ti—Ni—Au film is formed on the low-resistance semiconductor layer 112 thus forming the drain electrode 138 (see FIG. 7C).

In this manner, the power semiconductor device 100 according to the embodiment 1 can be manufactured.

3. Advantages Acquired by the Power Semiconductor Device 100 and the Method of Manufacturing a Power Semiconductor Device According to the Embodiment 1

According to the power semiconductor device 100 and the method of manufacturing a power semiconductor device of the embodiment 1, the power semiconductor device 100 includes: the contact holes 130 formed such that the contact holes 130 penetrate the interlayer insulation film 128 and reach at least the base regions 118; and the metal plugs 132 formed by filling the inside of the contact holes 130 with metal. Accordingly, in the same manner as the power MOSFET 900 described in Background Art, it is unnecessary to form contact holes having a large diameter as in the case of a power semiconductor device where the source electrode 136 is directly brought into contact with the source regions 120 and hence, it is possible to provide a downsized power semiconductor device. As a result, the power semiconductor device 100 and the method of manufacturing a power semiconductor device according to the embodiment 1 become a power semiconductor device and a method of manufacturing a power semiconductor device which satisfy a demand for reduction in cost and downsizing of electronic equipment.

In the power semiconductor device 100 and the method of manufacturing a power semiconductor device according to the embodiment 1, the power semiconductor device 100 includes: the contact holes 130 formed such that the contact holes 130 penetrate the interlayer insulation film 128 and reach at least the base regions 118 and two contact holes 130 are formed between each two trenches 122 disposed adjacently to each other; and the metal plugs 132 which are formed by filling the inside of the contact holes 130 with metal.

Figure 23:
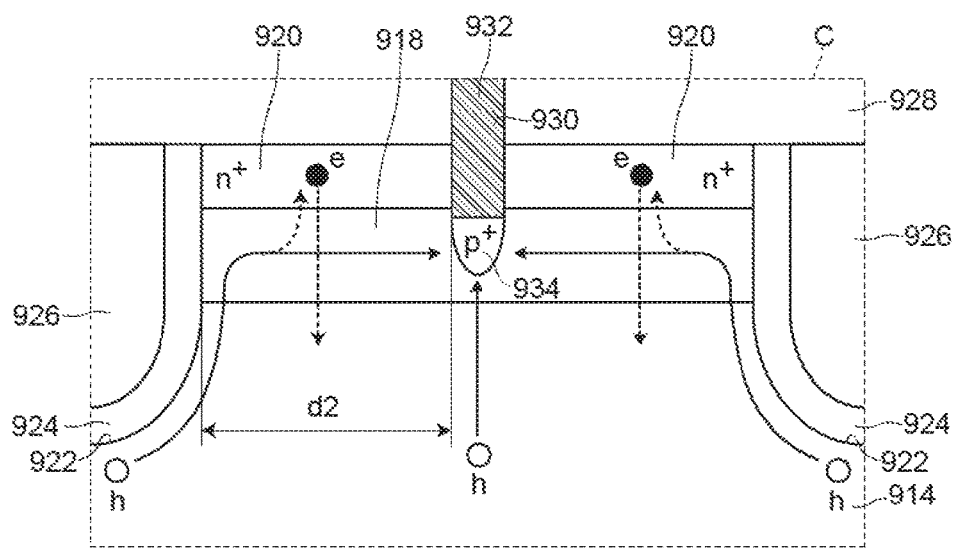
FIG. 23 is an enlarged cross-sectional view of a main part of the power MOSFET 900 described in Background Art for explaining a state where holes are drawn to a source electrode through a p$^+$-type high concentration diffusion region 934 and a metal plug 932 at the time of the occurrence of an avalanche breakdown or reverse recovery of a body diode.

With such a configuration, as viewed in a plan view, a distance d1 (see FIG. 8) between the trench 122 and the p$^+$-type diffusion region 134 becomes shorter than a distance d2 (see FIG. 23) in the power MOSFET 900 described in Background Art. Accordingly, the following advantageous effects are acquired.

(1) At the time of the occurrence of an avalanche breakdown or reverse recovery of a body diode, holes generated in the bottom portion of the trench 122 (a place where holes are relatively easily generated) move a relatively small distance until the holes are drawn to the source electrode 136 and hence, a high potential difference is minimally generated between the base region 118 and the metal plug 132. Accordingly, a parasitic npn transistor formed of the source region 120 (n type), the base region 118 (p type), and the n-type columnar region 114 (n type) is minimally turned on (see FIG. 8).

Figure 8:
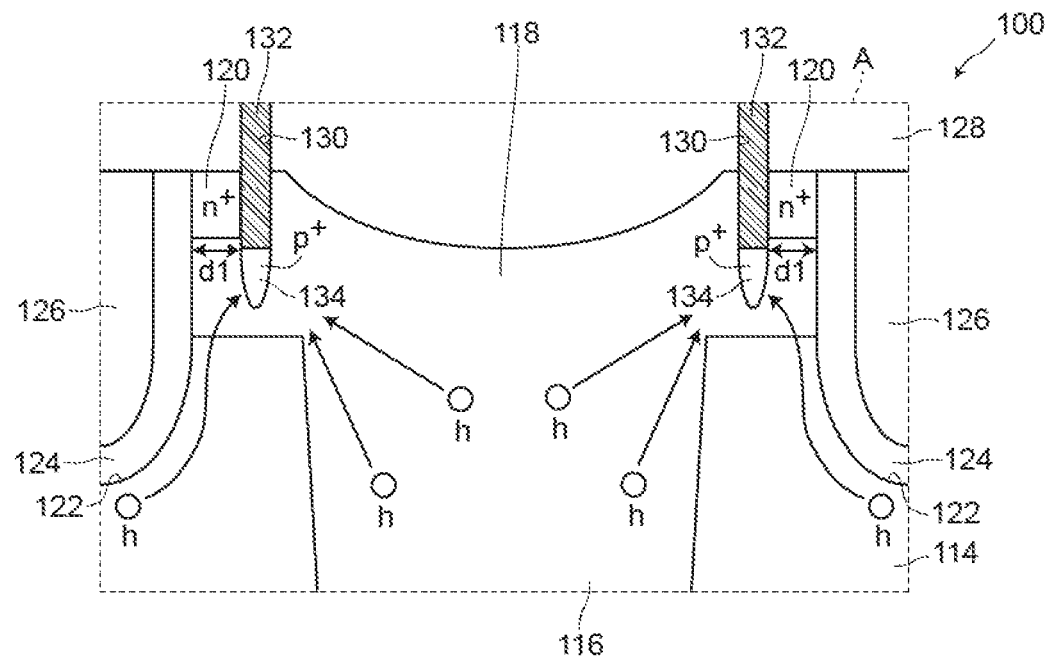
FIG. 8 is an enlarged cross-sectional view of a main part of the power semiconductor device 100 according to the embodiment 1 for explaining a state where holes are drawn to a source electrode through a p$^+$-type diffusion region 134 and a metal plug 132 at the time of the occurrence of an avalanche breakdown or reverse recovery of a body diode.

(2) An area of "the boundary surface between the source region 120 and the base region 118" becomes narrow and hence, holes in the base region 118 minimally enter the source region 120 whereby, also from this point of view, the above-mentioned parasitic npn transistor is minimally turned on (see FIG. 8).

As a result, in the power semiconductor device 100 and the method of manufacturing a power semiconductor device according to the embodiment 1, avalanche breakdown or di/dt breakdown minimally occurs and hence, it is possible to provide a power semiconductor device having a large breakdown strength and a method of manufacturing such a power semiconductor device.

Accordingly, the power semiconductor device 100 and the method of manufacturing a power semiconductor device according to the embodiment 1 can provide a power semiconductor device which can satisfy a demand for reduction in cost and downsizing of electronic equipment, and has a large breakdown strength.

In the power semiconductor device 100 and the method of manufacturing a power semiconductor device of the embodiment 1, the semiconductor device 100 includes: the contact holes 130 which are formed such that two contact holes 130 are formed between each two trenches 122 disposed adjacently to each other; and the metal plugs 132 which are formed by filling the inside of the contact holes 130 with metal. Accordingly, the power semiconductor device 100 can reduce contact resistance compared to the case where the semiconductor device 100 includes the contact holes which are formed such that one contact hole is formed between each two trenches 122 disposed adjacently to each other, and the metal plug is formed by filling the inside of the contact hole with metal (for example, as in the case of the power semiconductor device described in Background Art).

In the power semiconductor device 100 of the embodiment 1, the source region 120 is formed only between the trench 122 and the metal plug 132 disposed closest to the trench between two trenches 122 disposed adjacently to each other. With such a configuration, the area of "the boundary surface between the source region 120 and the base region 118" becomes narrow and hence, holes further minimally enter the source region 120 whereby the above-mentioned parasitic npn transistor is minimally turned on with certainty.

The power semiconductor device 100 according to the embodiment 1 includes the semiconductor base body 110 which has the super junction structure formed of the plurality of n-type columnar regions 114 and the plurality of p-type columnar regions 116 and hence, an ON resistance can be lowered while maintaining a high breakdown strength.

The power semiconductor device 100 according to the embodiment 1 includes the semiconductor base body 110 which has the super junction structure formed of the plurality of n-type columnar regions 114 and the plurality of p-type columnar regions 116 and hence, even when the power semiconductor device is a power semiconductor device having a high breakdown strength in this manner, it is possible to provide a power semiconductor device which satisfies a demand for reduction in cost and downsizing of electronic equipment, and has a large breakdown strength.

Figure 9:
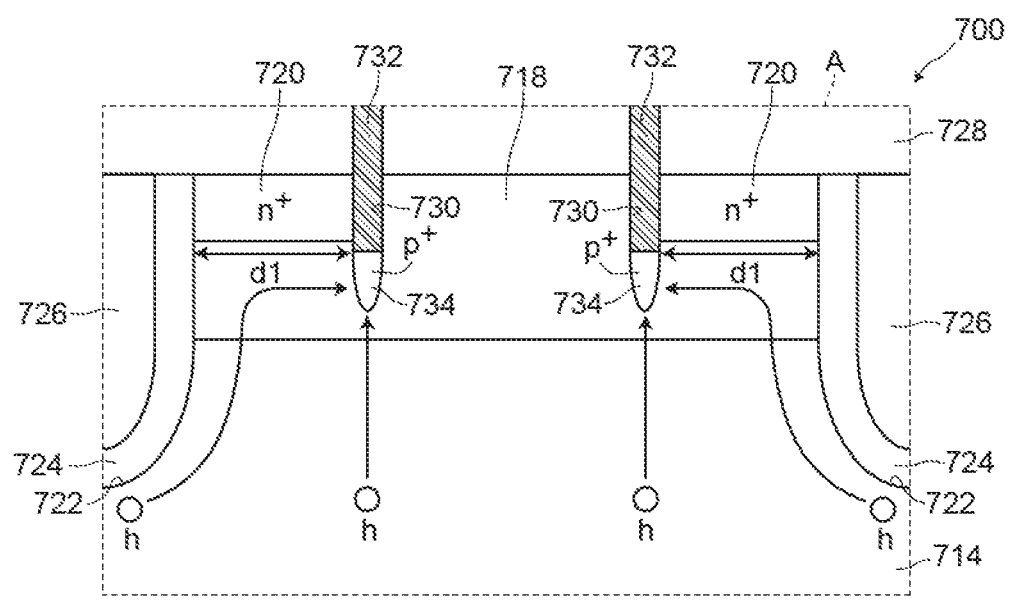
FIG. 9 is an enlarged cross-sectional view of a main part of a power semiconductor device 700 according to a comparison example 1 for explaining a state where holes are drawn to a source electrode through a p$^+$-type diffusion region 734 and a metal plug 732 at the time of the occurrence of an avalanche breakdown or reverse recovery of a body diode. The power semiconductor device 700 according to the comparison example 1 is a power semiconductor device having substantially the same configuration as the power semiconductor device 100 of the embodiment 1 except for a point that the power semiconductor device 700 includes a semiconductor base body having an n-type drift layer 714 in place of a semiconductor base body having the super junction structure.

By the way, when a power semiconductor device includes a semiconductor base body having no super junction structure, at the time of the occurrence of an avalanche breakdown and reverse recovery of a body diode, carriers (holes) are generated directly below a trench in a drift layer. Accordingly, by shortening a length dl from a trench 722 to a metal plug 730 (a power semiconductor device 700 according to a comparison example 1, see FIG. 9), carriers (holes) minimally enter a source region 720. On the other hand, when a power semiconductor device includes a semiconductor base body where a super junction structure is formed of n-type columnar regions 814 and p-type columnar regions 816, a large amount of carriers (holes) is generated in the p-type columnar regions 816 in addition to areas directly below trenches 822 in the n-type columnar regions 814. Then, the carriers (holes) generated in the p-type columnar regions 816 move toward a source electrode side, and are drawn to a source electrode through p$^+$-type diffusion regions 834 and metal plugs 832 (see FIG. 10).

Figure 10:
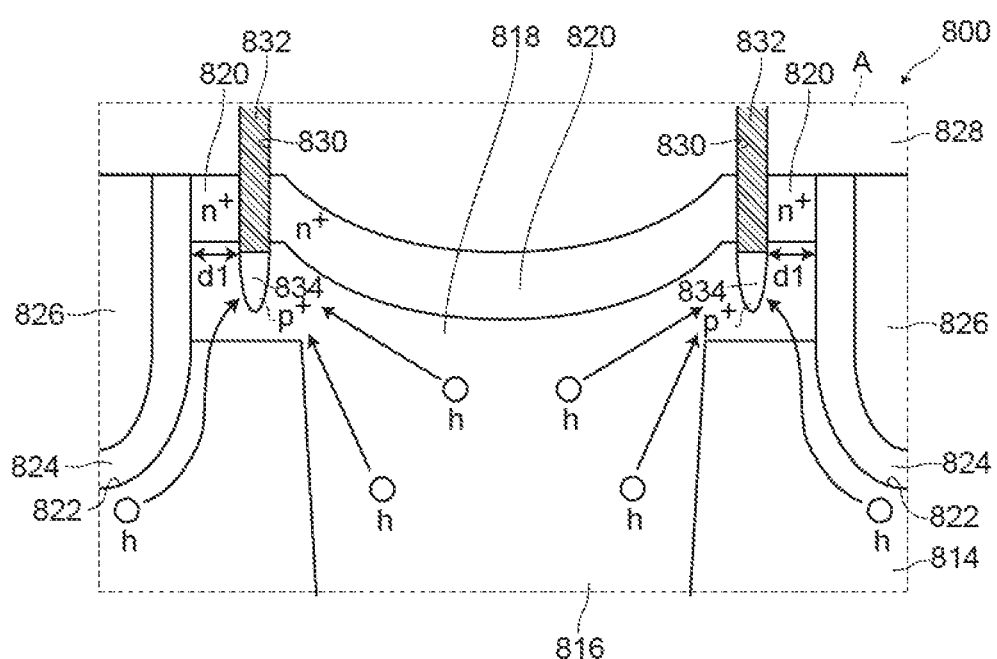
FIG. 10 is an enlarged cross-sectional view of a main part of a power semiconductor device 800 according to a comparison example 2 for explaining a state where holes are drawn to a source electrode through a p$^+$-type diffusion region 834 and a metal plug 832 at the time of the occurrence of an avalanche breakdown or reverse recovery of a body diode. The power semiconductor device 800 according to the comparison example 2 is a power semiconductor device having substantially the same configuration as the power semiconductor device 100 of the embodiment 1 except for a point that a source region 820 is formed also between two metal plugs 832 which are disposed adjacently to each other between two trenches 822 which are disposed adjacently to each other.

However, when the source region 820 is formed also between two metal plugs 832 disposed adjacently to each other between two trenches 822 disposed adjacently to each other (a power semiconductor device 800 according to a comparison example 2, see FIG. 10), carriers (holes) generated in the p-type columnar region 816 move near the source region 820 formed between two metal plugs 832 disposed adjacently to each other. Accordingly, carriers (holes) easily enter the source region 820 between two metal plugs 832 disposed adjacently to each other and hence, a parasitic transistor (parasitic npn transistor) formed of: the source region 820 (for example, n type) formed between two metal plugs 832 disposed adjacently to each other; the base region 818 (for example, p type); and the n-type columnar regions 814 (for example, n type) is liable to be turned on.

On the other hand, in the power semiconductor device 100 and the method of manufacturing a power semiconductor device according to the embodiment 1, the power semiconductor device 100 includes the semiconductor base body 110 where the super junction structure is formed of the n-type columnar regions 114 and the p-type columnar regions 116, and the source region 120 is formed only between the trench 122 and the metal plug 132 disposed closest to the trench 122 between two trenches 122 disposed adjacently to each other. Accordingly, there is no possibility that carriers generated in the p-type columnar region 116 move near the source region 120 so that there is no possibility that the carriers (holes) enter the source region 120. Accordingly, there is also no possibility that the parasitic transistor (the parasitic npn transistor) formed of the source region 120 (for example, n type) formed between two metal plugs 132 disposed adjacently to each other, the base region 118 (for example, p type) and the n-type columnar region 114 (for example, n type) is turned on. As a result, even in the case where the power semiconductor device 100 includes the semiconductor base body 110 where the super junction structure is formed of the n-type columnar region 114 and the p-type columnar regions 116, avalanche breakdown or di/dt breakdown minimally occurs thus providing a power semiconductor device having high breakdown strength.

Figure 11A:
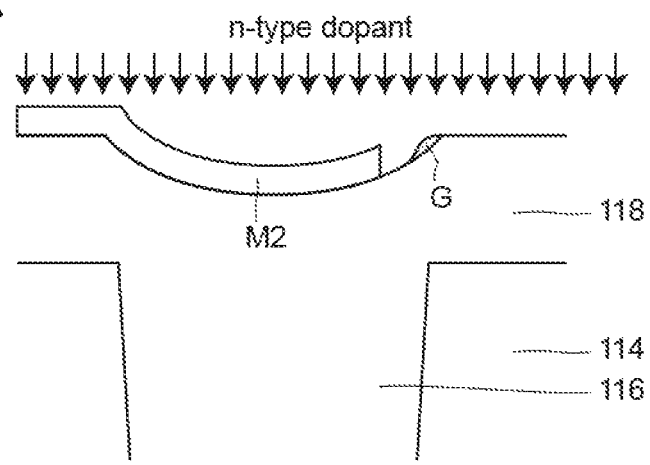
FIG. 11A to FIG. 11C are enlarged cross-sectional views of a main part of the power semiconductor device 100 according to the embodiment 1 for explaining an advantageous effect of the power semiconductor device 100.
Figure 11B:
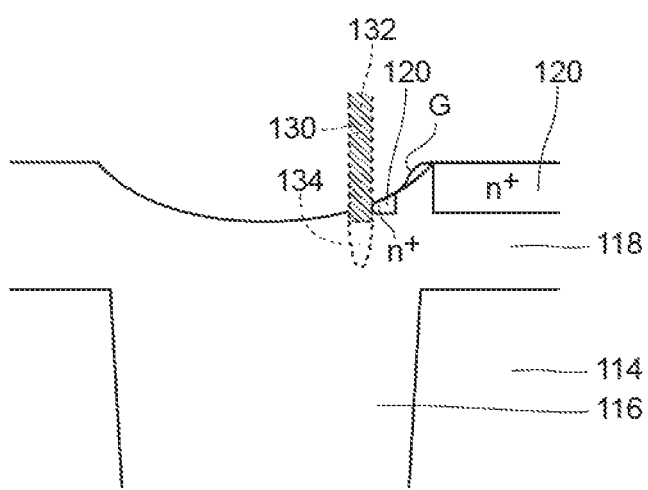

Further, as viewed in a plan view, when recessed portions are formed on the surface of the semiconductor base body over the whole region where each p-type columnar region 116 is formed and over a portion of the region where each n-type columnar region 114 is formed, particles G are liable to be adhered to side wall portions of each recessed portion. Accordingly, the injection of an n-type dopant is obstructed by the particles G thus giving rise to a possibility that the source region 120 is formed in an isolated state (see FIG. 11A and FIG. 11B). Further, when an n-type dopant is injected by ion implantation, an n-type dopant is obliquely injected by ion implantation at a shallow angle with respect to the side wall of the recessed portion and hence, a dopant is minimally injected thus giving rise to a possibility that the source region 120 causes so-called step cutting.

Accordingly, in the case where, between two trenches 122 disposed adjacently to each other, the metal plug 132 disposed closest to the trench 122 is formed inside the region where the p-type columnar region 116 is formed as viewed in a plan view, there may be a case where the source region 120 is formed in an isolated state or a so-called step cutting occurs and hence, there is a possibility of causing a connection failure between the source electrode 136 and the source region 120.

Figure 11C:
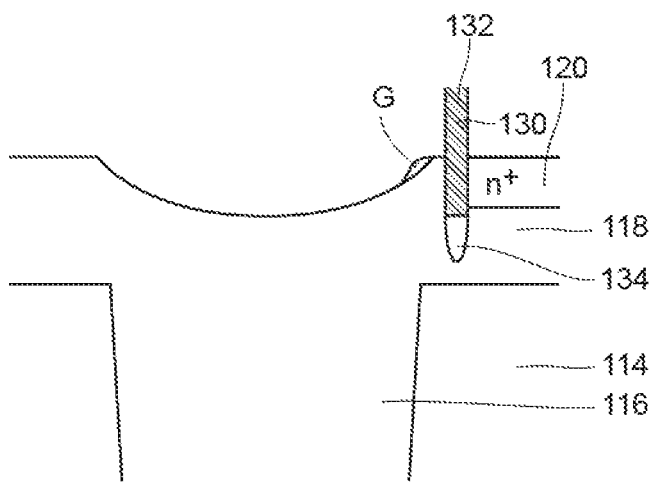

On the other hand, in the power semiconductor device 100 according to the embodiment 1, between two trenches 122 disposed adjacently to each other, the metal plug 132 disposed closest to the trench 122 is formed outside the region where the p-type columnar region 116 is formed as viewed in a plan view and hence, a contact portion between the source region 120 and the metal plug 132 is formed outside the side wall of the recessed portion. Accordingly, even when particles G are adhered to the side wall portion of the recessed portion, there is no possibility that the source region 120 is formed in an isolated state (see FIG. 11C). Further, even when ion implantation is performed, there is no possibility that the source region 120 is formed on the side wall of the recessed portion and hence, there is also no possibility that the source region 120 causes so-called step cutting. Accordingly, there is no possibility that a connection failure between the source electrode 136 and the source region 120 occurs due to such step-cutting.

According to the power semiconductor device 100 of the embodiment 1, metal is tungsten and hence, metal can be easily filled in the contact hole 130 having a small diameter so that the metal plug 132 having a small diameter can be formed thus providing a downsized power semiconductor device.

In a power semiconductor device where a source electrode is brought into direct contact with a source region, a stepped portion is formed in the source electrode between a region where an interlayer insulation film exists and a region where an interlayer insulation film does not exist (contact region) and hence, when a wire bonding is performed on the source electrode at the time of mounting the power semiconductor device, there is a possibility that a stress generated by ultrasonic waves is concentrated on the stepped portion (particularly, a corner portion of a side surface of the interlayer insulation film (a boundary portion of a contact hole)) so that the power semiconductor device is broken. On the other hand, according to the power semiconductor device 100 of the embodiment 1, metal is tungsten so that metal is easily filled in the contact hole 130 having a small diameter. Accordingly, when the inside of the contact hole 130 is filled with tungsten, a stepped portion is minimally formed between a region where the interlayer insulation film 128 exists and a region where the interlayer insulation film 128 does not exist (a region of the metal plug 132) so that the source electrode 136 can be formed as a flat film. Accordingly, even when wire bonding is performed on the source electrode 136 at the time of mounting the power semiconductor device, it is possible to prevent a stress generated by ultrasonic waves from being concentrated on a portion of the interlayer insulation film 128 and hence, it is possible to prevent breaking of the power semiconductor device.

In the power semiconductor device 100 according to the embodiment 1, a distance between two gate electrodes 126 disposed adjacently to each other is set to 2.5 µm or more and hence, gate capacity can be decreased. As a result, it is possible to reduce an amount of charge which a gate drive circuit (connected to the power semiconductor device 100) inputs to the gate electrode 126 or outputs from the gate electrode 126 at the time of switching thus lowering a drive loss.

That is, (1) at the time of turning on the power semiconductor device 100, the gate drive circuit applies a plus bias to the gate electrode 126 so as to supply a gate current to the gate electrode 126. A gate charge amount is obtained by multiplying a gate current amount by an energization time. When the gate capacity is reduced, the gate charge amount is also reduced and hence, a product of the gate current amount and the energization time can be made small. As a result, either the reduction of a gate current amount or the shortening of an energization time becomes possible thus eventually reducing a power loss on a drive circuit side.

(2) At the time of turning off the power semiconductor device 100, the gate drive circuit applies a minus bias or 0 bias to the gate electrode 126 so that a gate current is drawn from the gate electrode 126. At this stage of operation, (a) in the case where a gate charge amount is reduced, when an energization time is shortened while maintaining a gate current amount substantially at the same level as a gate current amount before the gate charge amount is reduced, a product of the gate current and the energization time can be made small. Accordingly, an amount of charge which the gate drive circuit inputs to the gate electrode or outputs from the gate electrode can be reduced. As a result, a drive loss can be reduced. Further, (b) even in the case where a switching speed of a MOSFET is intentionally reduced, and a relatively large external gate resistance is inserted between the gate electrode 126 and the gate drive circuit for avoiding the generation of ringing and noises in the circuit, the external gate resistance has an effect of reducing a gate current amount and hence, an energization time can be prolonged whereby a switching time can be prolonged. Accordingly, a gate charge amount which is a product of a gate current amount and an energization time is maintained at a small value as it is. As a result, a drive loss can be reduced.

Accordingly, as described in the above-mentioned cases (1) and (2), it is possible to reduce an amount of charge which the gate drive circuit inputs to the gate electrode 126 or outputs from the gate electrode 126 at the time of switching thus reducing a drive loss.

As in the case of the above-mentioned (2) (a), when a gate charge amount is decreased, by shortening an energization time while maintaining a gate current amount substantially at the same level as a gate current amount before the gate charge amount is reduced, a switching speed can be increased so that the circuit can be operated at a high speed. However, when a switching speed is increased, a possibility that ringing and noises are generated in the circuit is increased thus increasing a possibility that the MOSFET is brought into an avalanche state or a possibility that the MOSFET is exposed to steep di/dt at the time of reverse recovery of a body diode. On the other hand, according to the power semiconductor device 100 of the embodiment 1, as described above, a resistance against the avalanche breakdown and a resistance against the di/dt breakdown of the MOSFET are increased and hence, in an actual operation, a risk that the MOSFET is brought into breakdown is reduced.

Further, as in the case of the above-mentioned (2) (b), even in the case where a switching speed of a MOSFET is intentionally reduced, and a relatively large external gate resistance is inserted between the gate electrode 126 and the gate drive circuit for avoiding the generation of ringing and noises in the circuit, the external gate resistance has an effect of reducing a gate current amount and hence, an energization time can be prolonged whereby a switching time can be prolonged. As a result, a switching speed becomes slow so that a switching time is prolonged whereby dv/dt becomes gentle so that the generation of ringing and noises in the circuit can be avoided.

In this manner, according to the power semiconductor device 100 of the embodiment 1, since a gate capacity is reduced, an adjustment margin of a switching speed can be widened without losing a drive loss reducing effect and hence, the power semiconductor device 100 of the embodiment 1 can satisfy demands in a wide range from various application circuits.

According to the power semiconductor device 100 of the embodiment 1, a distance between two gate electrodes 126 disposed adjacently to each other is five or more times as large as a width of the metal plug 132 so that the distance between two gate electrodes 126 disposed adjacently to each other is wider than a distance between the gate electrode 126 and the metal plug 132. Accordingly, a volume of the gate electrode 126 can be relatively reduced and hence, the gate capacity can be reduced also from this point of view. As a result, an amount of charge which the gate drive circuit inputs to the gate electrode 126 or outputs from the gate electrode 126 at the time of switching can be reduced thus reducing a drive loss.

According to the power semiconductor device 100 of the embodiment 1, a distance between two gate electrodes 126 disposed adjacently to each other is five or more times as large as a width of the metal plug 132. Also from this point of view, since a gate capacity is reduced, an adjustment margin of a switching speed can be widened without losing a drive loss reducing effect. As a result, the power semiconductor device 100 of the embodiment 1 can satisfy demands in a wide range from various application circuits.

According to the power semiconductor device 100 of the embodiment 1, the contact hole 130 is formed such that the contact hole 130 and reaches a depth position deeper than the bottom surface of the source region 120. Accordingly, it is possible to prevent a dopant concentration and a region area of the source region 120 from being changed from the dopant concentration and the region area at the time of designing the source region 120 due to contact between the $p^+$-type diffusion region 134 formed on the bottom portion of the contact hole 130 and the source region 120 thus preventing the occurrence of a defect that characteristics of the power semiconductor device change.

According to the power semiconductor device 100 of the embodiment 1, a depth of the base region 118 falls within a range of from 0.5 µm to 2.0 µm and hence, it is unnecessary to diffuse a dopant at a high temperature for a long time in manufacturing steps. Accordingly, it is possible to provide a power semiconductor device suitable for the case where the power semiconductor device adopts the downsized structure so that it is difficult to diffuse a dopant for a long time.

[Embodiment 2]

Figure 12:
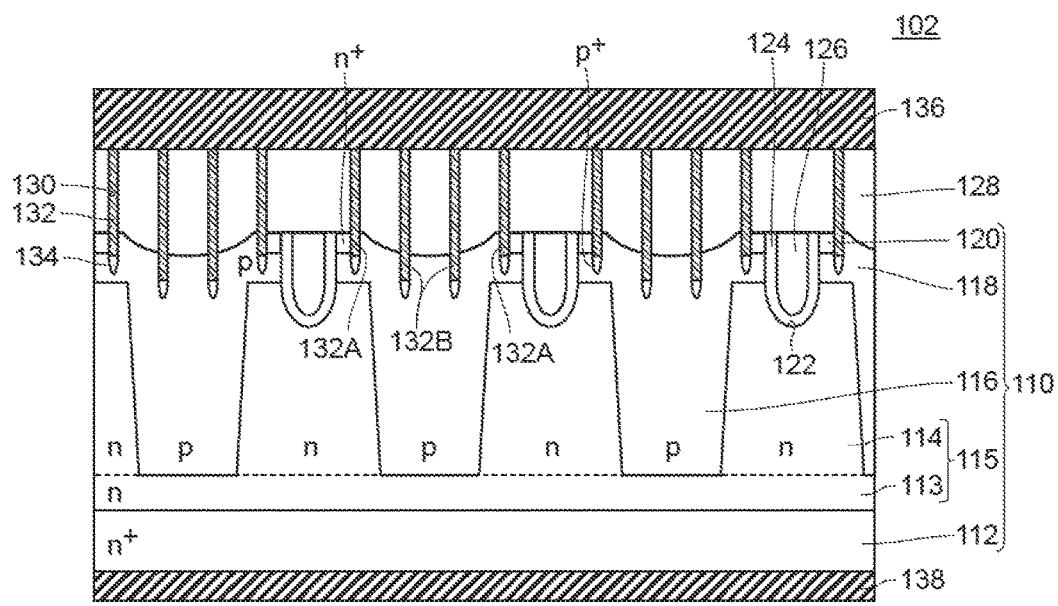
FIG. 12 is a cross-sectional view of a power semiconductor device 102 according to an embodiment 2.

A power semiconductor device 102 according to an embodiment 2 basically has substantially the same configuration as the power semiconductor device 100 according to the embodiment 1. However, the power semiconductor device 102 according to the embodiment 2 differs from the power semiconductor device 100 according to the embodiment 1 with respect to the number of metal plugs. That is, in the power semiconductor device 102 according to the embodiment 2, as shown in FIG. 12, four contact holes 130 are formed between each two trenches 122 disposed adjacently to each other, and metal is filled in the inside of each contact hole 130 thus forming four metal plugs 132.

The source region 120 is not formed between two metal plugs 132 disposed adjacently to each other between two trenches 122 disposed adjacently to each other. That is, between two trenches 122 disposed adjacently to each other, assuming the metal plugs disposed closest to the trenches as metal plugs 132A and assuming other metal plugs as metal plugs 132B, the metal plugs 132B are not brought into contact with the source regions 120.

The metal plug 132A and the metal plug 132B may be formed with the same depth, recessed portions are formed on a surface of the semiconductor base body 110 such that the recessed portion is formed over the whole region where each p-type columnar region 116 is formed and over a portion of the region where each n-type columnar region 114 is formed as viewed in a plan view. Accordingly, it is preferable that a length of the metal plug 132B (a depth of a contact hole) be longer (deeper) than a length of the metal plug 132A (a depth of a contact hole).

In this manner, although the power semiconductor device 102 according to the embodiment 2 differs from the power semiconductor device 100 according to the embodiment 1 with respect to the number of metal plugs, in the same manner as the power semiconductor device 100 according to the embodiment 1, the power semiconductor device 102 according to the embodiment 2 includes: the contact holes 130 which are formed such that the contact holes 130 penetrate an interlayer insulation film 128 and reach at least base regions 118; and the metal plugs 132 which are formed by filling the inside of the contact holes 130 with metal. Accordingly, it is possible to provide a power semiconductor device which satisfies a demand for reduction in cost and downsizing of electronic equipment, and has a large breakdown strength.

According to the power semiconductor device 102 of the embodiment 2, four contact holes 130 are formed between each two trenches 122 disposed adjacently to each other, and metal is filled in the inside of each contact hole 130 thus forming four metal plugs 132. Accordingly, at the time of applying a reverse bias, a depletion layer formed by a pn junction between the base region 118, p-type columnar regions 116 and n-type columnar regions 114 can be expanded over the whole region between two trenches disposed adjacently to each other with certainty.

The power semiconductor device 102 according to the embodiment 2 has substantially the same configuration as the power semiconductor device 100 according to the embodiment 1 except for the number of metal plugs. Accordingly, the power semiconductor device 102 of the embodiment 2 can acquire advantageous effects which correspond to advantageous effects out of advantageous effects which the power semiconductor device 100 according to the embodiment 1 can acquire.

[Embodiment 3]

Figure 13:
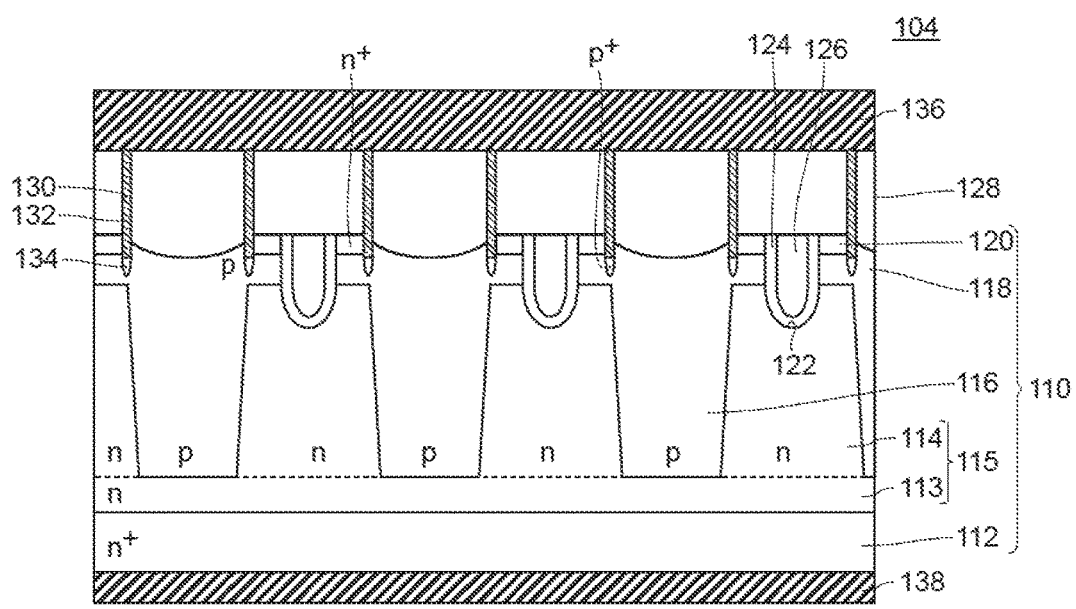
FIG. 13 is a cross-sectional view of a power semiconductor device 104 according to an embodiment 3.

A power semiconductor device 104 according to an embodiment 3 basically has substantially the same configuration as the power semiconductor device 100 according to the embodiment 1. However, the power semiconductor device 104 according to the embodiment 3 differs from the power semiconductor device 100 according to the embodiment 1 with respect to position of a metal plug disposed closest to a trench between two trenches disposed adjacently to each other. That is, in the power semiconductor device 104 according to the embodiment 3, as shown in FIG. 13, between two trenches 122 disposed adjacently to each other, the position where the metal plug 132 disposed closest to the trench 122 and a source region 120 are brought into contact with each other is disposed outside a region where a p-type columnar region 116 is formed as viewed in a plan view.

To be more specific, between two trenches 122 disposed adjacently to each other, the metal plug 132 disposed closest to the trench 122 is formed on a boundary line between a region where the n-type columnar region 114 is formed and a region where the p-type columnar region 116 is formed as viewed in a plan view.

In this manner, the power semiconductor device 104 according to the embodiment 3 differs from the power semiconductor device 100 according to the embodiment 1 with respect to a point that the power semiconductor device 104 according to the embodiment 3 has the super junction structure. However, in the same manner as the power semiconductor device 100 according to the embodiment 1, the power semiconductor device 104 according to the embodiment 3 includes: a plurality of contact holes 130 which are formed such that the contact holes 130 penetrate an interlayer insulation film 128, reach at least base regions 118, and two contact holes 130 are formed between each two trenches 122 disposed adjacently to each other; and metal plugs 132 which are formed by filling the inside of the contact holes 130 with metal. Accordingly, it is possible to provide a power semiconductor device which satisfies a demand for reduction in cost and downsizing of electronic equipment, and has a large breakdown strength.

According to the power semiconductor device 104 of the embodiment 3, the position where the metal plug 132 disposed closest to the trench 122 and the source region 120 are brought into contact with each other between two trenches 122 disposed adjacently to each other is disposed outside the region where the p-type columnar region 116 is formed as viewed in a plan view. Accordingly, also with such a configuration, there is no possibility that the source region 120 is formed in an isolated manner. Further, also at the time of performing the ion implantation, there is no possibility that the source region 120 is formed on a side wall of a recessed portion. Accordingly, there is also no possibility that the source region 120 causes so-called step cutting.

The power semiconductor device 104 according to the embodiment 3 has substantially the same configuration as the power semiconductor device 100 according to the embodiment 1 except for a point that the power semiconductor device 104 according to the embodiment 3 has the super junction structure. Accordingly, the power semiconductor device 104 of the embodiment 3 can acquire advantageous effects which correspond to the advantageous effects out of the advantageous effects which the power semiconductor device 100 according to the embodiment 1 can acquire.

Although the present invention has been described heretofore with reference to the above-mentioned embodiments, the present invention is not limited to the above-mentioned embodiments. Various modifications are conceivable without departing from the gist of the present invention. For example, the following modifications are also conceivable.

(1) The number, materials, shapes, positions, sizes and the like of the constitutional elements described in the above-mentioned embodiments are merely examples, and can be changed within a range where the advantageous effects of the present invention are not impaired.

Figure 14:
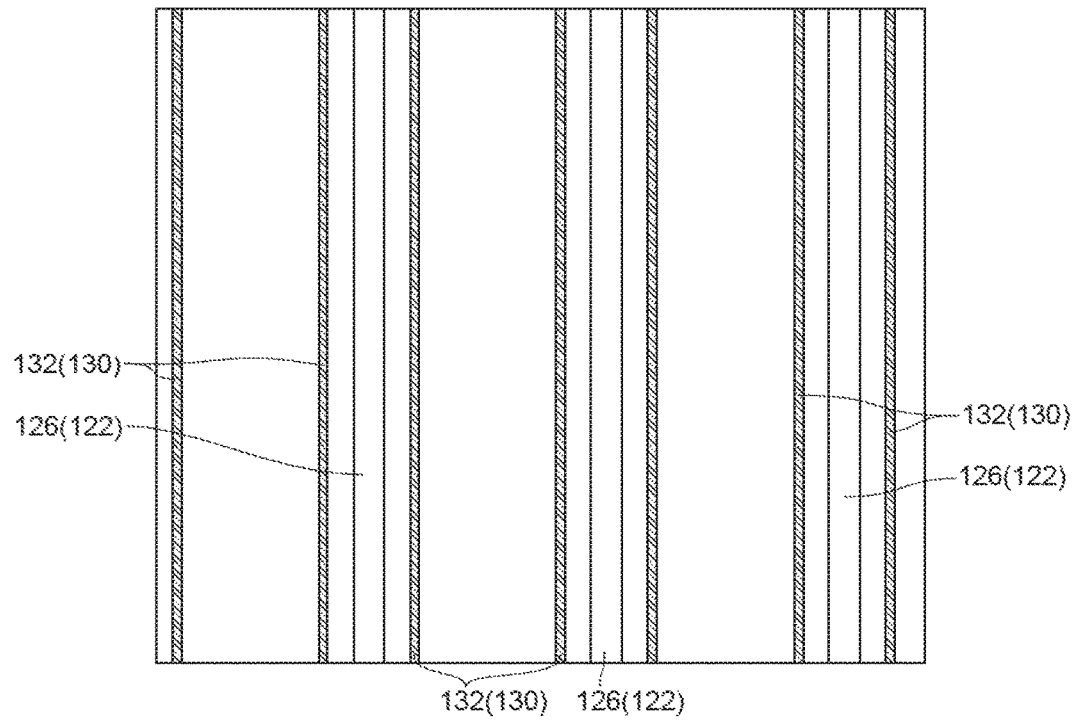
FIG. 14 is an enlarged cross-sectional view of a main part of the power semiconductor device 100 according to the embodiment 1. In the power semiconductor device 100 according to the embodiment 1, both a trench 122 and the metal plug 132 have a stripe shape as viewed in a plan view.
Figure 15:
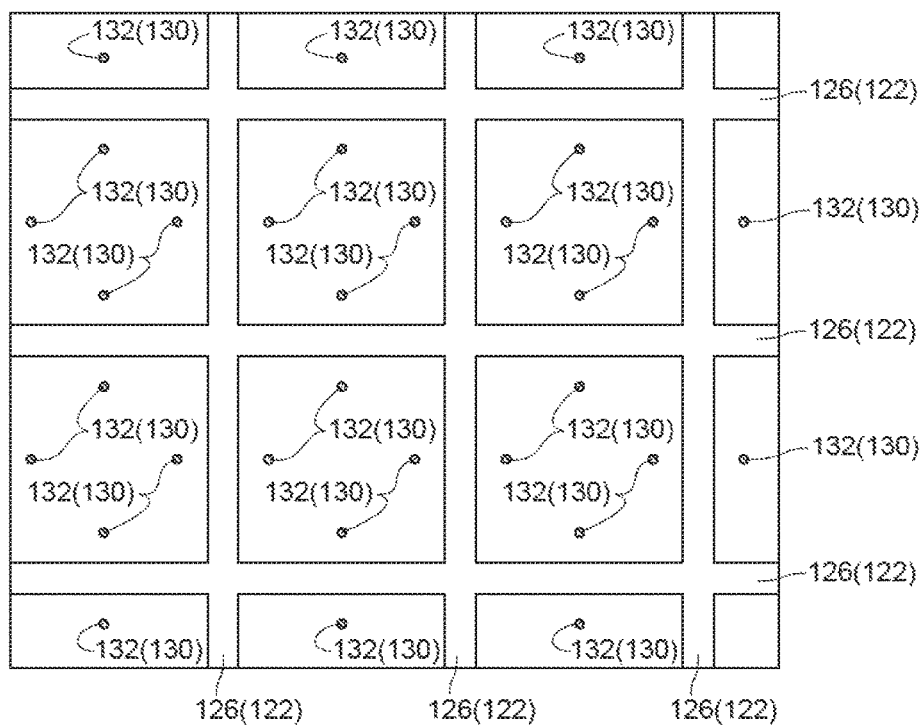
FIG. 15 is an enlarged plan view of a main part of a power semiconductor device according to a modification 1. In the power semiconductor device according to the modification 1, trenches 122 have a grid shape as viewed in a plan view, and a metal plug 132 has a circular shape as viewed in a plan view (a columnar shape as viewed in a stereoscopic view).
Figure 16:
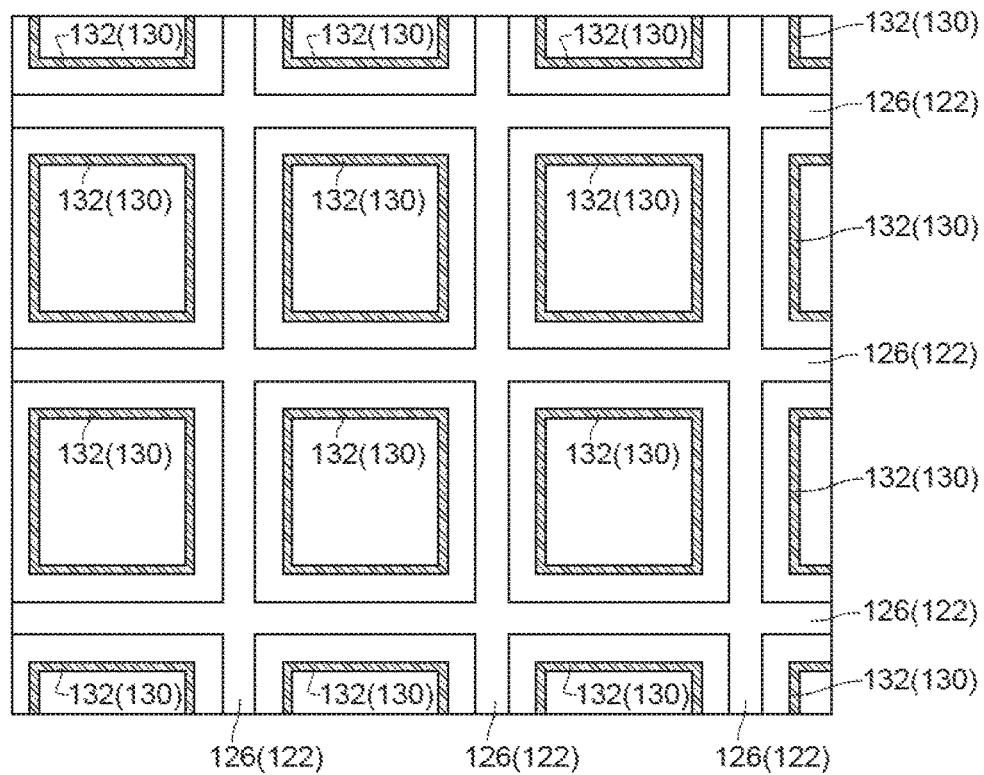
FIG. 16 is an enlarged plan view of a main part of a power semiconductor device according to a modification 2. In the power semiconductor device according to the modification 2, trenches 122 have a grid shape as viewed in a plan view, and a metal plug 132 has a quadrangular frame shape as viewed in a plan view.
Figure 17:
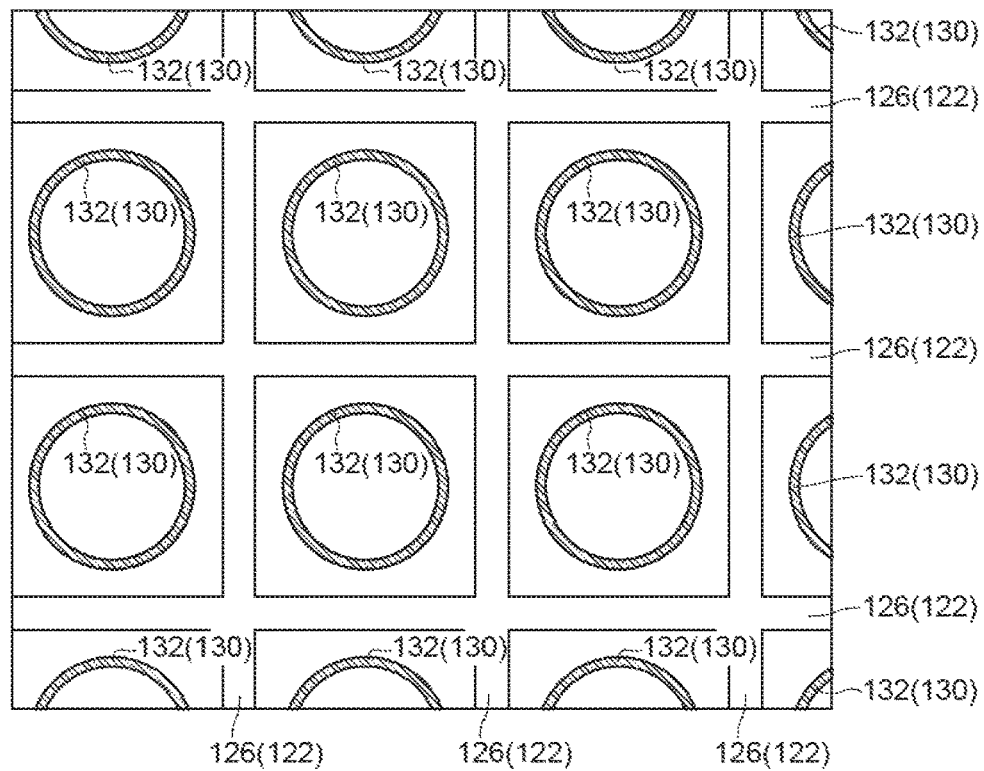
FIG. 17 is an enlarged plan view of a main part of a power semiconductor device according to a modification 3. In the power semiconductor device according to the modification 3, trenches 122 have a grid shape as viewed in a plan view, and a metal plug 132 has a circular frame shape as viewed in a plan view.
Figure 18:
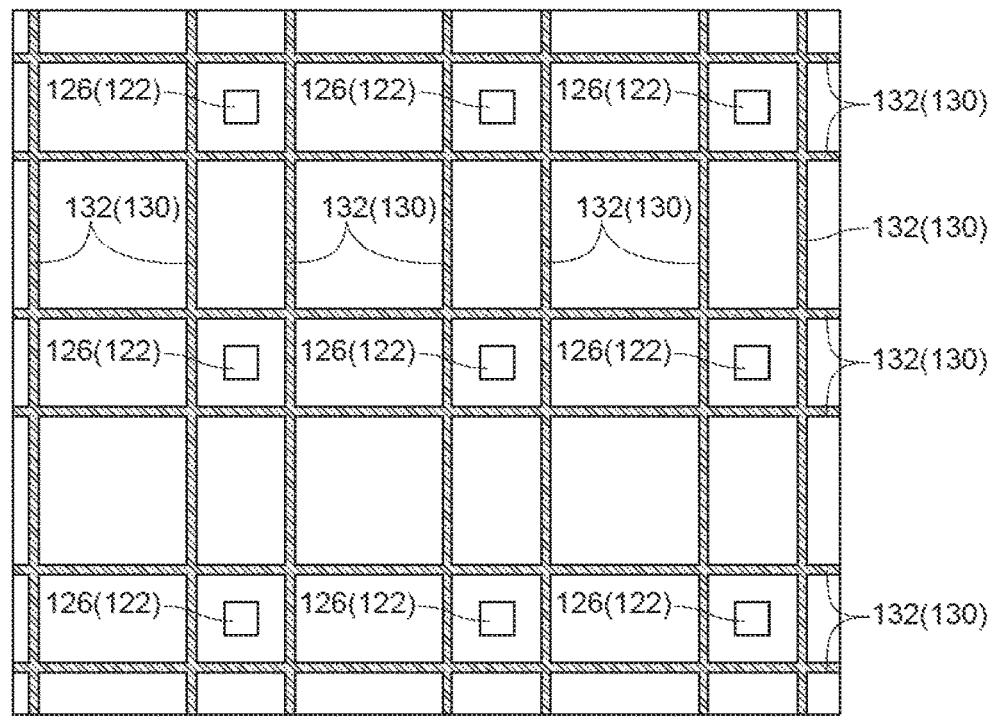
FIG. 18 is an enlarged plan view of a main part of a power semiconductor device according to a modification 4. In the power semiconductor device according to the modification 4, a trench 122 has a rectangular shape as viewed in a plan view (a columnar shape as viewed in a stereoscopic view), and metal plugs 132 have a grid shape as viewed in a plan view.
Figure 19:
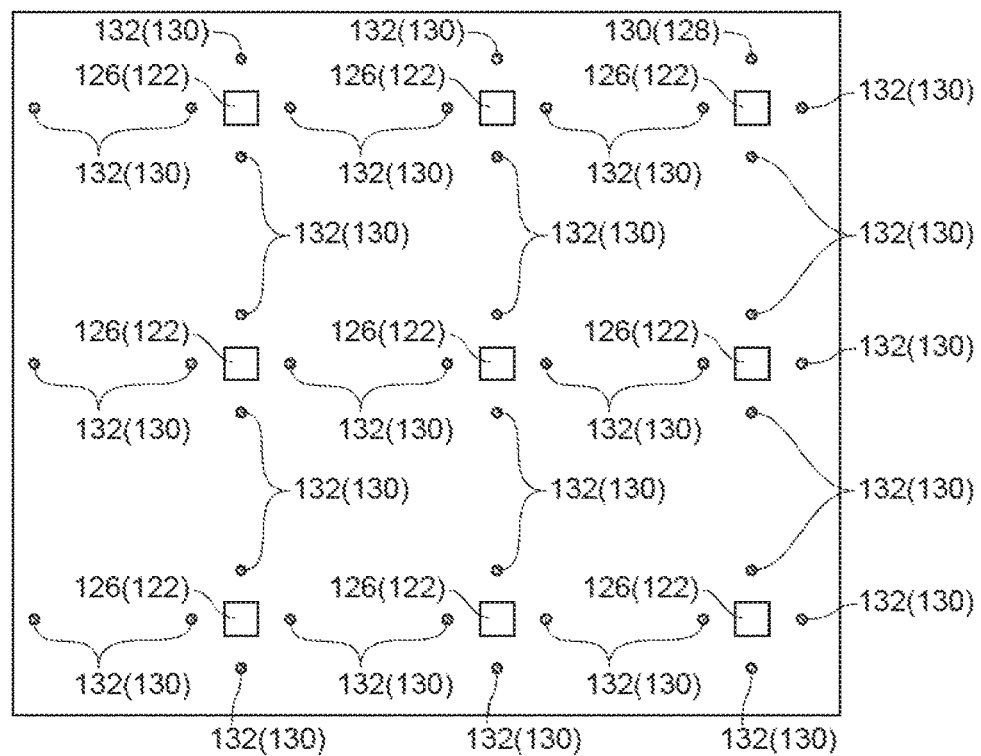
FIG. 19 is an enlarged plan view of a main part of a power semiconductor device 106 according to a modification 5. In the power semiconductor device 106 according to the modification 5, a trench 122 has a rectangular shape as viewed in a plan view (a columnar shape as viewed in a stereoscopic view), and a metal plug 132 has a circular shape as viewed in a plan view (a columnar shape as viewed in a stereoscopic view).

(2) In the above-mentioned respective embodiments, although the metal plug 132 is formed into a stripe shape as viewed in a plan view (see FIG. 14), the present invention is not limited to such a configuration. The metal plug may be formed into a circular shape (a columnar shape as viewed in a stereoscopic view, see FIG. 15 and FIG. 19), a quadrangular frame shape (see FIG. 16), a circular frame shape (see FIG. 17), a grid shape (see FIG. 18) or the like as viewed in a plan view.

(3) In the above-mentioned respective embodiments, although the trench 122 is formed into a stripe shape as viewed in a plan view (see FIG. 14), the present invention is not limited to such a configuration. The trench may be formed into a rectangular shape (a columnar shape as viewed in a stereoscopic view, see FIG. 18 and FIG. 19), a grid shape (see FIG. 15 to FIG. 17) or the like as viewed in a plan view.

(4) In the above-mentioned respective embodiments, although the present invention is applied to the MOSFET, the present invention is not limited to such an application. The present invention may be applied to a suitable power semiconductor device such as an IGBT, a thyristor, a triac, or a diode.

(5) In the above-mentioned respective embodiments, although the contact hole 130 is formed so as to reach the base region 118, the present invention is not limited to such a configuration. The contact hole 130 may be formed so as to reach the n-type columnar region 114 or the p-type columnar region 116. In this case, an advantageous effect that holes can be easily drawn to the source electrode 136 at the time of the occurrence of an avalanche breakdown and reverse recovery of a body diode can be acquired.

(6) In the above-mentioned respective embodiments, although the p$^+$-type diffusion region 134 is formed only in the bottom portion of each contact hole 130, the present invention is not limited to such a configuration. The p$^+$-type diffusion region 134 may be formed at a portion of a side portion (a portion of a side portion on a bottom portion side) of the contact hole 130 in addition to the bottom portion of the contact hole 130. In this case, it is possible to prevent breaking of the power semiconductor device caused by contacting of the depletion layer with the contact plug when an avalanche breakdown or reverse recovery of a body diode occurs.

(7) In the above-mentioned embodiments 1 and 3, two metal plugs 132 (contact holes 130) are formed between each two trenches 122 disposed adjacently to each other, while in the above-mentioned embodiment 2, four metal plugs 132 (contact holes 130) are formed between each two trenches 122 disposed adjacently to each other. However, the present invention is not limited to such a configuration. Three, five or more metal plugs 132 (contact holes 130) may be formed between each two trenches 122 disposed adjacently to each other.

Figure 20:
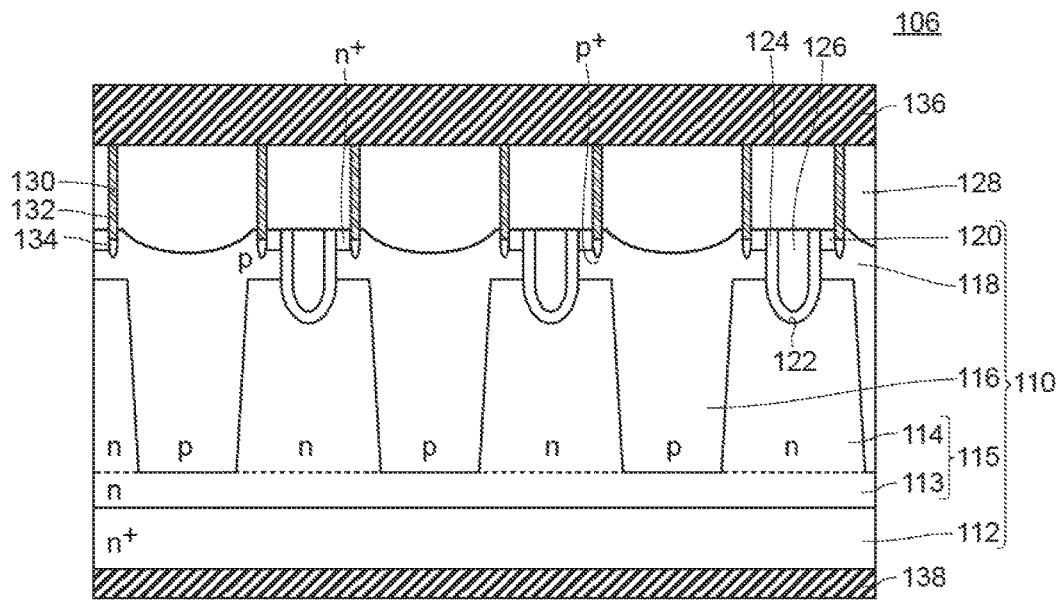
FIG. 20 is a cross-sectional view of the power semiconductor device 106 according to a modification 6.

(8) In the above-mentioned respective embodiments, although the contact hole 130 is formed such that the contact hole 130 reaches a depth position deeper than the bottom surface of the source region 120, the present invention is not limited to such a configuration. A contact hole 130 may be formed such that the contact hole 130 reaches a depth position shallower than a bottom surface of a source region 120 (power semiconductor device 106 according to a modification 6, see FIG. 20).

(9) In the above-mentioned respective embodiments, as viewed in a plan view, the recessed portions are formed on the surface of the semiconductor base body such that the recessed portion is formed over the whole regions where the p-type columnar region 116 is formed and the recessed portion is formed on a portion of the region where the n-type columnar region 114 is formed. However, the present invention is not limited to such a configuration. Recessed portions may not be formed on the surface of the semiconductor base body.

Figure 21:
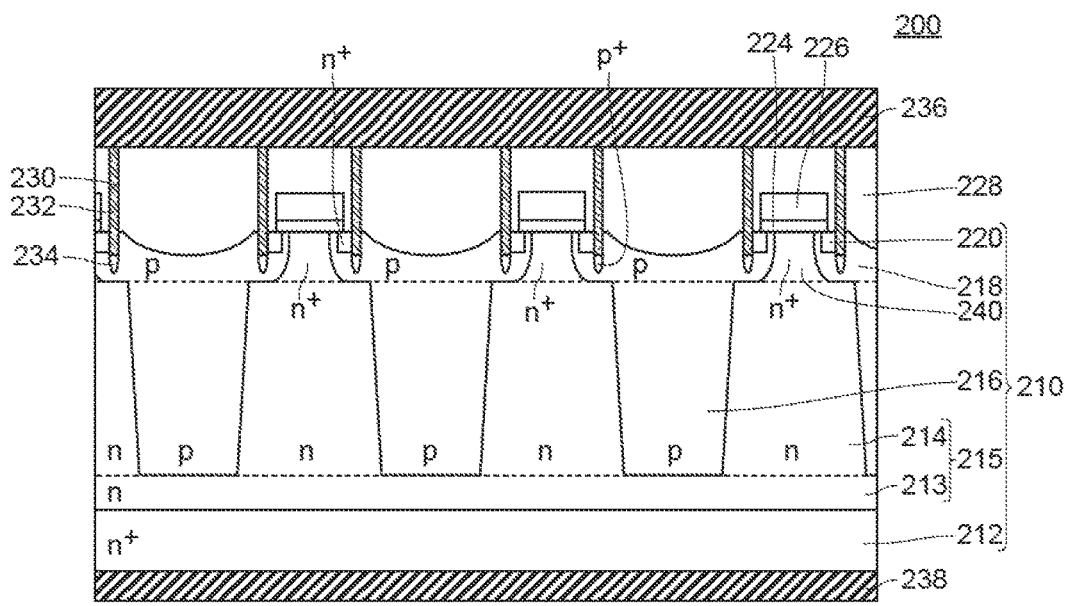
FIG. 21 is a cross-sectional view of a power semiconductor device 200 according to a modification 7.
Figure 22:
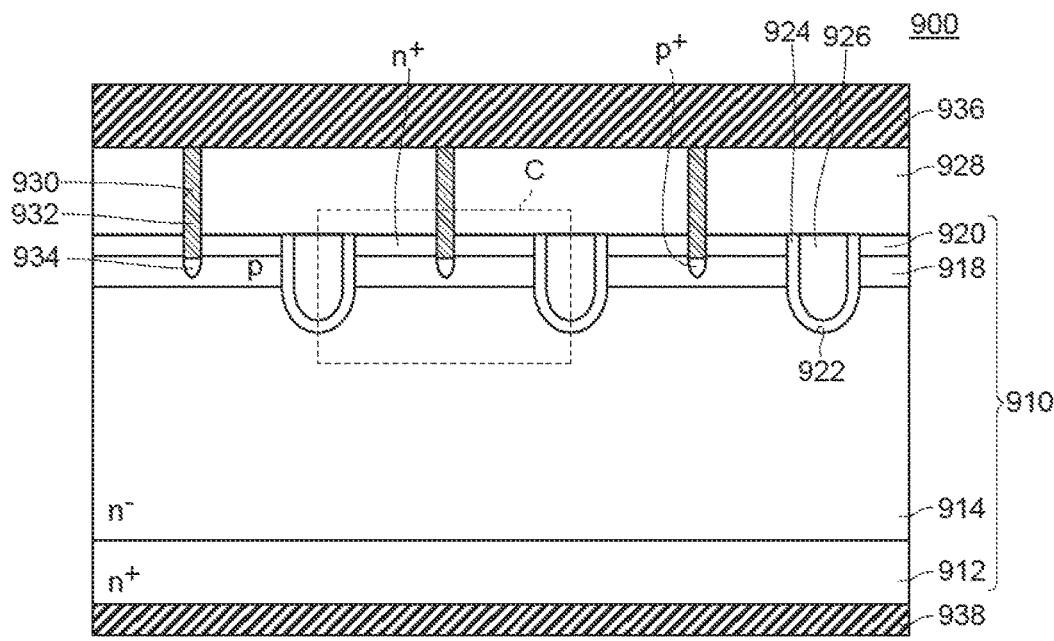
FIG. 22 is a cross-sectional view of a power MOSFET 900 described in Background Art.

(10) In the above-mentioned respective embodiments, in the trench-gate-type power semiconductor device, the position where the metal plug disposed closest to the trench (gate electrode) and the source region are brought into contact with each other is disposed outside the region where the p-type columnar region is formed as viewed in a plan view. However, the present invention is not limited to such a configuration. In a planar-gate-type power semiconductor device, a position where a metal plug disposed closest to a gate electrode and a source region are brought into contact with each other may be disposed outside a region where a p-type columnar region is formed as viewed in a plan view (for example, a power semiconductor device 200 according to a modification 7, see FIG. 21). Also in this case, in the same manner as the above-mentioned respective embodiments, a source region 220 is formed only between a gate electrode 226 and a metal plug 232 disposed closest to the gate electrode 226 between two gate electrodes 226 disposed adjacently to each other.

The invention claimed is:

1. A power semiconductor device comprising:
   a semiconductor base body having:
      a low resistance semiconductor layer;
      a first conductive-type semiconductor layer formed on the low resistance semiconductor layer and having lower dopant concentration than the low resistance semiconductor layer;
      a plurality of second conductive-type column trenches arranged on a surface of the first conductive-type semiconductor layer along a predetermined direction;
      a plurality of second conductive-type columnar regions formed of an epitaxial regions of a second conductive-type semiconductor material formed in the second conductive-type column trenches;
      second conductive-type base regions formed on surfaces of the first conductive-type semiconductor layer and the plurality of second conductive-type columnar regions; and
      first conductive-type high concentration diffusion regions formed on surfaces of the base regions at predetermined positions, wherein
         regions sandwiched between the plurality of second conductive-type column trenches disposed adjacently to each other in the first conductive-type semiconductor layer forms a plurality of first conductive-type columnar regions,
         the plurality of first conductive-type columnar regions and the plurality of second conductive-type columnar regions are alternately formed along a predetermined direction, and
         a super junction structure is formed of the plurality of first conductive-type columnar regions and the plurality of second conductive-type columnar regions;
   a plurality of trenches formed within regions where the first conductive-type columnar regions are formed as viewed in a plan view, the trenches being formed such that the trenches penetrate the base regions and extend to a depth position where the trenches reach the first conductive-type columnar regions, the trenches allowing portions of the first conductive-type high concentration diffusion regions to be exposed on respective inner peripheral surfaces of the respective trenches;
   gate insulation films each of which is formed on the inner peripheral surface of each trench;
   gate electrodes each of which is embedded in each trench by way of the gate insulation film;
   an interlayer insulation film formed so as to cover the base regions, the first conductive-type high concentration diffusion regions, the gate insulation films and the gate electrodes;
   contact holes formed such that the contact holes penetrate the interlayer insulation film and reach at least the base regions, two or more contact holes being formed between each two trenches disposed adjacently to each other;
   metal plugs formed by filling the inside of the contact holes with metal; and
   an electrode formed on the interlayer insulation film, the electrode being electrically connected with the base regions and the first conductive-type high concentration diffusion regions through the metal plugs, wherein
   the semiconductor base body further comprises second conductive-type high concentration diffusion regions which are brought into contact with bottom surfaces of the metal plugs, are electrically connected with the electrode through the metal plugs, and have higher dopant concentration than the base region, and
   in the semiconductor base body, the first conductive-type high concentration diffusion region is formed only between the trench and the metal plug disposed closest to the trench between two trenches disposed adjacently to each other,
   wherein the plurality of second conductive-type columnar regions is formed in the entire interior of and fills the entirety of each of the second conductive-type column trenches.

2. The power semiconductor device according to claim 1, wherein, between two trenches disposed adjacently to each other, a position where the metal plug disposed closest to the trench and the first conductive-type high concentration diffusion region are brought into contact with each other is disposed outside a region where the second conductive-type columnar region is formed as viewed in a plan view.

3. The power semiconductor device according to claim 1, wherein, between two trenches disposed adjacently to each other, the metal plug disposed closest to the trench is formed outside a region where the second conductive-type columnar region is formed as viewed in a plan view.

4. The power semiconductor device according to claim 1, wherein the metal is tungsten.

5. The power semiconductor device according to claim 1, wherein a distance between two gate electrodes disposed adjacently to each other is 2.5 µm or more.

6. The power semiconductor device according to claim 1, wherein a distance between two gate electrodes disposed adjacently to each other is five or more times as large as a width of the metal plug.

7. The power semiconductor device according to claim 1, wherein the contact hole is formed such that the contact hole extends to a depth position deeper than a bottom surface of the first conductive-type high concentration diffusion region.

8. The power semiconductor device according to claim 1, wherein a depth position of a deepest portion of the base region falls within a range of from 0.5 µm to 2.0 µm.

* * * * *